(12) United States Patent
Jobetto

(10) Patent No.: US 7,727,862 B2
(45) Date of Patent: Jun. 1, 2010

(54) SEMICONDUCTOR DEVICE INCLUDING SEMICONDUCTOR CONSTITUENT AND MANUFACTURING METHOD THEREOF

(75) Inventor: Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/194,846

(22) Filed: Aug. 20, 2008

(65) Prior Publication Data

US 2009/0051038 A1 Feb. 26, 2009

(30) Foreign Application Priority Data

Aug. 24, 2007 (JP) ............... 2007-217876

(51) Int. Cl.
*H01L 21/301* (2006.01)
(52) U.S. Cl. ............... 438/464; 438/68; 438/113; 438/460; 438/E21.576
(58) Field of Classification Search ............... 438/33, 438/68, 108–113, 460–465
See application file for complete search history.

(56) References Cited

U.S. PATENT DOCUMENTS

| | | | |
|---|---|---|---|
| 6,590,291 B2 * | 7/2003 | Akagawa | 257/774 |
| 6,608,374 B1 | 8/2003 | Lin et al. | |
| 6,809,414 B1 | 10/2004 | Lin et al. | |
| 2002/0135058 A1 | 9/2002 | Asahi et al. | |
| 2003/0090883 A1 | 5/2003 | Asahi et al. | |
| 2004/0201085 A1 | 10/2004 | Ogawa et al. | |
| 2004/0245614 A1 | 12/2004 | Jobetto | |
| 2005/0140007 A1 | 6/2005 | Jobetto | |
| 2006/0125082 A1 | 6/2006 | Wakabayashi et al. | |
| 2007/0042594 A1 | 2/2007 | Wakabayashi et al. | |
| 2007/0080458 A1 | 4/2007 | Ogawa et al. | |
| 2007/0086166 A1 | 4/2007 | Kurita et al. | |
| 2008/0014681 A1 | 1/2008 | Jobetto | |
| 2008/0166836 A1 | 7/2008 | Jobetto | |
| 2008/0182366 A1 | 7/2008 | Ogawa et al. | |

FOREIGN PATENT DOCUMENTS

| | | |
|---|---|---|
| EP | 1 225 629 A2 | 7/2002 |
| EP | 1 304 742 A2 | 4/2003 |
| JP | 2000-223518 A | 8/2000 |
| JP | 2005-216935 A | 8/2005 |

OTHER PUBLICATIONS

International Search Report and Written Opinion of the International Searching Authority dated Mar. 9, 2009, issued in corresponding International Application No. PCT/JP2008/065348.

* cited by examiner

*Primary Examiner*—Dung A. Le
(74) *Attorney, Agent, or Firm*—Frishauf, Holtz, Goodman & Chick, P.C.

(57) ABSTRACT

A semiconductor device includes a semiconductor constituent having a semiconductor substrate and a plurality of electrodes for external connection provided under the semiconductor substrate. An under-layer insulating film is provided under and around the semiconductor constituent. A plurality of under-layer wires are provided under the under-layer insulating film and electrically connected to the electrodes for external connection of the semiconductor constituent. An insulating layer is provided around the semiconductor constituent and on the under-layer insulating film. A frame-like insulating substrate is embedded in an upper surface of the insulating layer and positioned around the semiconductor constituent. A plurality of upper-layer wires are provided on the insulating substrate. A base plate on which the semiconductor constituent and the insulating layer are mounted is removed.

13 Claims, 37 Drawing Sheets

US 7,727,862 B2

SEMICONDUCTOR DEVICE INCLUDING SEMICONDUCTOR CONSTITUENT AND MANUFACTURING METHOD THEREOF

CROSS-REFERENCE TO RELATED APPLICATIONS

This application is based upon and claims the benefit of priority from prior Japanese Patent Application No. 2007-217876, filed Aug. 24, 2007, the entire contents of which are incorporated herein by reference.

BACKGROUND OF THE INVENTION

1. Field of the Invention

The present invention relates to a semiconductor device including a semiconductor constituent, and a manufacturing method of the semiconductor device.

2. Description of the Related Art

In certain types of conventional semiconductor devices, a plurality of columnar electrodes for external connection are provided under a silicon substrate as disclosed in, for example, Jpn. Pat. Appln. KOKAI Publication No. 2000-223518. Such a conventional semiconductor device has a (Fan-in) constitution in which the electrodes for external connection are provided in the planar area region of a semiconductor constituent, and hence the semiconductor device cannot be applied to a case where the number of the electrodes for external connection to be arranged increases and an arrangement pitch is smaller than a predetermined dimension of, for example, about 0.5 μm.

Moreover, in Jpn. Pat. Appln. KOKAI Publication No. 2005-216935, there is disclosed a semiconductor device employing a Fan-out structure where a semiconductor constituent referred to as a chip size package (CSP) is provided on a base plate having a planar size larger than that of the semiconductor constituent and almost all the region of this base plate is the arrangement region of the electrodes for external connection of the semiconductor constituent. In the semiconductor device employing this Fan-out structure, the arrangement region of the electrodes for external connection can be broadened, and hence a sufficient arrangement pitch can be obtained even in a case where the number of the electrodes for external connection to be arranged is large.

In this conventional semiconductor device, there are serious problems that the base plate for mounting the semiconductor constituent thereon is necessary, and this base plate increases the thickness of the whole device.

BRIEF SUMMARY OF THE INVENTION

An object of this invention is to provide a semiconductor device in which the arrangement region of electrodes for external connection is larger than the planar size of a semiconductor constituent but which can be thinned, and to provide a manufacturing method of the semiconductor device.

According to one aspect of this invention, there is provided a semiconductor device comprising:

a semiconductor constituent having a semiconductor substrate and a plurality of electrodes for external connection provided under the semiconductor substrate;

an under-layer insulating film provided under and around the semiconductor constituent;

a plurality of under-layer wires provided under the under-layer insulating film and electrically connected to the electrodes for external connection of the semiconductor constituent;

an insulating layer provided around the semiconductor constituent and on the under-layer insulating film;

a frame-like insulating substrate embedded in an upper surface of the insulating layer and positioned around the semiconductor constituent; and a plurality of upper-layer wires provided on the insulating substrate, wherein a base plate on which the semiconductor constituent and the insulating layer are mounted being removed.

Moreover, according to another aspect of this invention, there is provided a manufacturing method of a semiconductor device, comprising:

forming an under-layer insulating film on a base plate;

securing, onto the under-layer insulating film, a plurality of semiconductor constituents each having a semiconductor substrate and a plurality of electrodes for external connection provided under the semiconductor substrate;

forming an insulating layer on the under-layer insulating film around the semiconductor constituents, and embedding a frame-like insulating substrate in an upper surface of the insulating layer;

removing the base plate;

connecting under-layer wires to the electrodes for external connection of the semiconductor constituent under the under-layer insulating film; and cutting the under-layer insulating film, the insulating layer and the insulating substrate between the semiconductor constituents to obtain a plurality of semiconductor devices, an upper-layer wire being formed on the insulating substrate.

According to this invention, the arrangement region of the electrodes for external connection can be larger than the planar size of the semiconductor constituent, and additionally the base plate is not disposed, so that the semiconductor device can be thinned.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
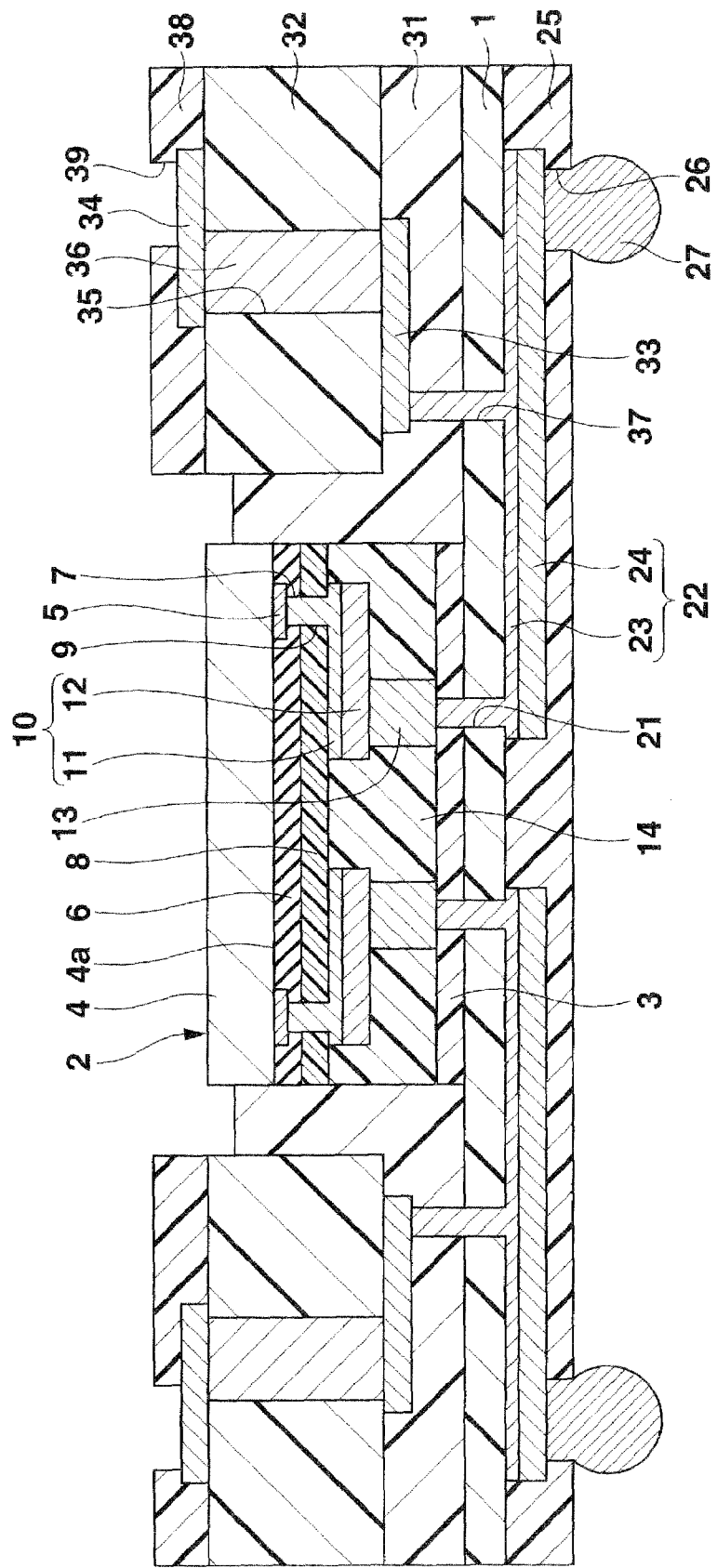
FIG. 1 is a sectional view of a semiconductor device according to a first embodiment of this invention.

FIG. 1 shows a sectional view of a semiconductor device according to a first embodiment of this invention. This semiconductor device includes an under-layer insulating film 1 having a rectangular planar shape and made of an epoxy-based resin, a polyimide-based resin, a glass cloth-based epoxy resin or the like. A semiconductor constituent 2 is mounted on the center of the upper surface of the under-layer insulating film 1 via an adhesive layer 3 made of the epoxy-based resin or the like. The planar size of the under-layer insulating film 1 is larger than that of the semiconductor constituent 2.

The semiconductor constituent 2 includes a silicon substrate (a semiconductor substrate) 4 having a rectangular planar shape. An under surface 4a of the silicon substrate 4 is provided with an integrated circuit (not shown) having a predetermined function, and a plurality of connection pads 5 made of an aluminum-based metal or the like are mounted on the peripheral portion of the under surface of the substrate, and electrically connected to the integrated circuit. The under surfaces of the silicon substrate 4 and the centers of the connection pads are provided or covered with an insulating film 6 made of silicon oxide or the like. The centers of the connection pads 5 are exposed through openings 7 formed through the insulating film 6.

The under surface of the insulating film 6 is provided with a protective film 8 made of the polyimide-based resin or the like. The protective film 8 in portions corresponding to the openings 7 of the insulating film 6 is provided with openings or through holes 9. The under surface of the protective film 8 is provided with a plurality of upper-layer wires 10. Each of the upper-layer wires 10 has a double-layer structure of a base metal layer 11 made of copper on the under surface of the protective film 8, and an upper metal layer 12 made of copper on the under surface of the base metal layer 11. One end of each wire 10 is electrically connected to the connection pad 5 via the openings 7, 9 of the insulating film 6 and the protective film 8.

The under surfaces of the connection pad portions of the wires 10 are provided with columnar electrodes (electrodes for external connection) 13 made of copper. A sealing film 14 made of the epoxy-based resin or the like is provided on the under surfaces of the wires 10 and the protective film 8 so that the under surface of the sealing film is on the same plane as the under surface of each columnar electrode 13. The under surfaces of the columnar electrodes 13 and the sealing film 14 of the semiconductor constituent 2 are bonded to the center of the upper surface of the under-layer insulating film 1 via the adhesive layer 3 made of the epoxy-based resin or the like, whereby the semiconductor constituent 2 is fixedly mounted on the center of the upper surface of the under-layer insulating film 1.

The under-layer insulating film 1 and the adhesive layer 3 in portions corresponding to the centers of the under surfaces of the columnar electrodes 13 of the semiconductor constituent 2 are provided with openings 21. The under surface of the under-layer insulating film 1 is provided with a plurality of under-layer insulating wires 22. Each of the under-layer wires 22 has a double-layer structure of a base metal layer 23 made of copper on the under surface of the under-layer insulating film 1, and a lower metal layer 24 made of copper on the under surface of the base metal layer 23. One end of the under-layer wire 22 is electrically connected to each columnar electrode 13 of the semiconductor constituent 2 via the openings 21 of the under-layer insulating film 1 and the adhesive layer 3.

The under surfaces of the under-layer wire 22 and under-layer insulating film 1 are provided with an under-layer overcoat film or layer 25 made of a solder resist or the like. The under-layer overcoat film 25 in portions corresponding to the connection pad portions of the under-layer wires 22 is provided with openings 26. In and under the openings 26 of the under-layer overcoat film 25, solder balls (solder layers) 27 are connected to the connection pad portions of the under-layer wires 22.

The upper surface of the portion of the under-layer insulating film 1 around the adhesive layer 3 and semiconductor constituent 2 is provided with an insulating layer 31. The insulating layer 31 is made of the epoxy-based resin, the polyimide-based resin, the glass cloth-based epoxy resin or the like. A rectangular frame-like insulating substrate 32 made of the glass cloth-based epoxy resin or the like is embedded in the upper surface of the insulating layer 31. In other words, around the semiconductor constituent 2, the rectangular frame-like insulating substrate 32 is arranged leaving a space between the insulating substrate and the semiconductor constituent 2, and the insulating layer 31 is positioned between the adhesive layer 3 and semiconductor constituent 2 and the insulating substrate 32 and between the insulating substrate 32 and the under-layer insulating film 1.

The under surface of the insulating substrate 32 is provided with a plurality of intermediate under-layer wires 33 made of a copper foil. The upper surface of the insulating substrate is provided with a plurality of upper-layer wires 34 made of the copper foil. Each of the intermediate under-layer wire 33 is electrically connected to the upper-layer wire 34 via a vertical conductive portion 36. The conductive portion 36 is made of a conductive paste or the like, and fills a through hole 35 vertically extended through the insulating substrate 32. The predetermined portion of the under-layer wire 22 is electrically connected to the inner end or connection pad portion of the intermediate under-layer wire 33 via openings 37 formed in the under-layer insulating film 1 and insulating layer 31.

The upper surfaces of the upper-layer wires 34 and the insulating substrate 32 are provided with an upper-layer overcoat film 38 made of the solder resist or the like. The upper-layer overcoat film 38 in a portion corresponding to the outer end or connection pad portion of the upper-layer wire 34 is provided with an opening 39. The upper-layer overcoat film 38 is not present on the upper surface of the silicon substrate 4 of the semiconductor constituent 2 or the upper surface of the insulating layer 31 positioned between the semiconductor constituent 2 and the insulating substrate 32.

Figure 2:
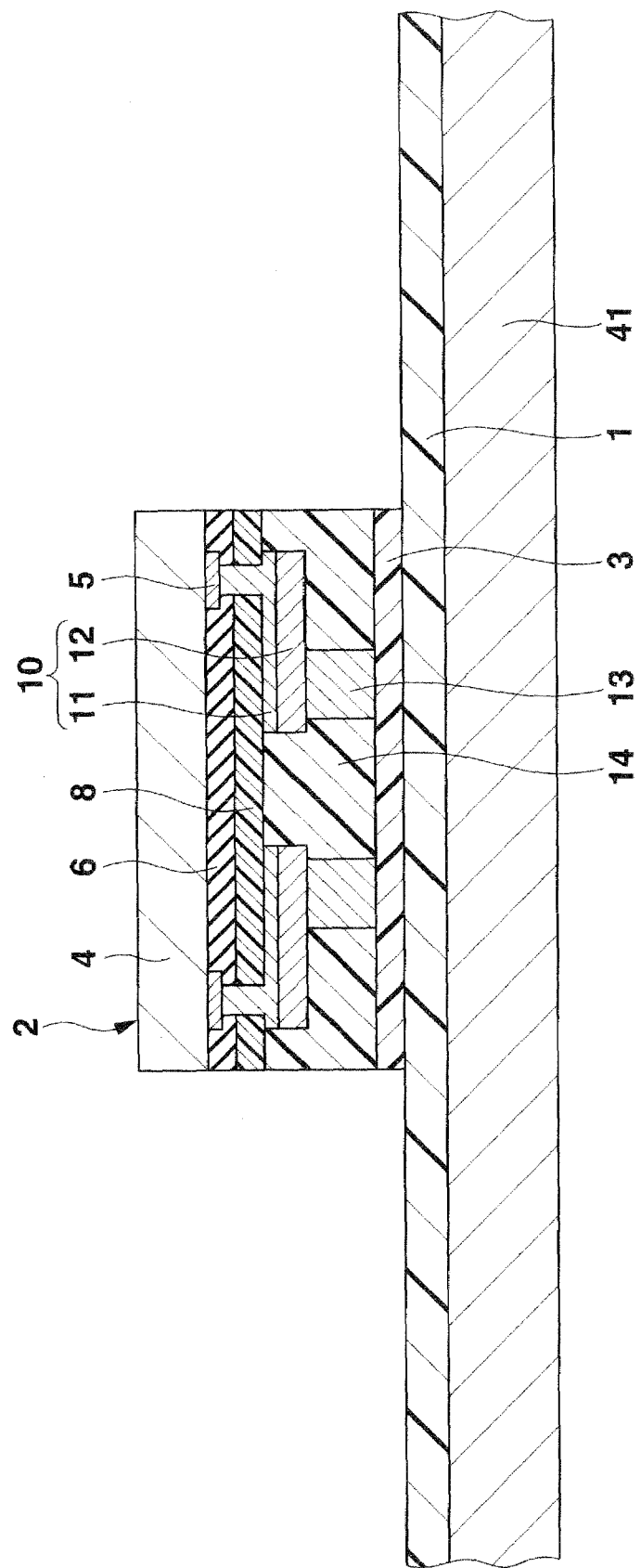
FIG. 2 is a sectional view of an assembly in an initial step according to one example of a manufacturing method of the semiconductor device shown in FIG. 1.

Next, one example of a manufacturing method of this semiconductor device will be described. First, as shown in FIG. 2, an assembly is prepared in which the under-layer insulating film 1 made of the epoxy-based resin, the polyimide-based resin, the glass cloth-based epoxy resin or the like is formed on the upper surface of a base plate 41 made of the copper foil (the metal foil). In this case, the thus prepared assembly has such a size that a plurality of semiconductor devices completed as shown in FIG. 1 can be formed. Moreover, a thermosetting resin made of the epoxy-based resin or the like in the under-layer insulating film 1 has already been cured.

Moreover, the semiconductor constituents 2 are prepared. To obtain each of the semiconductor constituents 2, there are formed, under the silicon substrate 4 having a wafer state, the integrated circuit (not shown), the connection pads 5 made of the aluminum-based metal or the like, the insulating film 6 made of silicon oxide or the like, the protective film 8 made of the polyimide-based resin or the like, the wires 10 (having the base metal layers 11 made of copper and the upper metal layers 12 made of copper), the columnar electrodes 13 made of copper and the sealing film 14 made of the epoxy-based resin or the like, and then individual pieces are obtained by dicing.

Next, the under surfaces of the columnar electrodes 13 and sealing film 14 of the semiconductor constituent 2 are bonded to each of semiconductor constituent mounted regions on the upper surface of the under-layer insulating film 1 via the adhesive layer 3 made of the epoxy-based resin or the like, to mount the semiconductor constituent 2 on the region. A paste-like adhesive material referred to as a non-conductive paste (NCP) is supplied to the semiconductor constituent mounted region on the upper surface of the under-layer insulating film 1 by use of a printing process, a dispenser or the like, or a sheet-like adhesive material referred to as a non-conductive film (NCF) is beforehand supplied to the region, and the semiconductor constituent 2 is secured to the under-layer insulating film 1 by heating and pressing.

Figure 3:
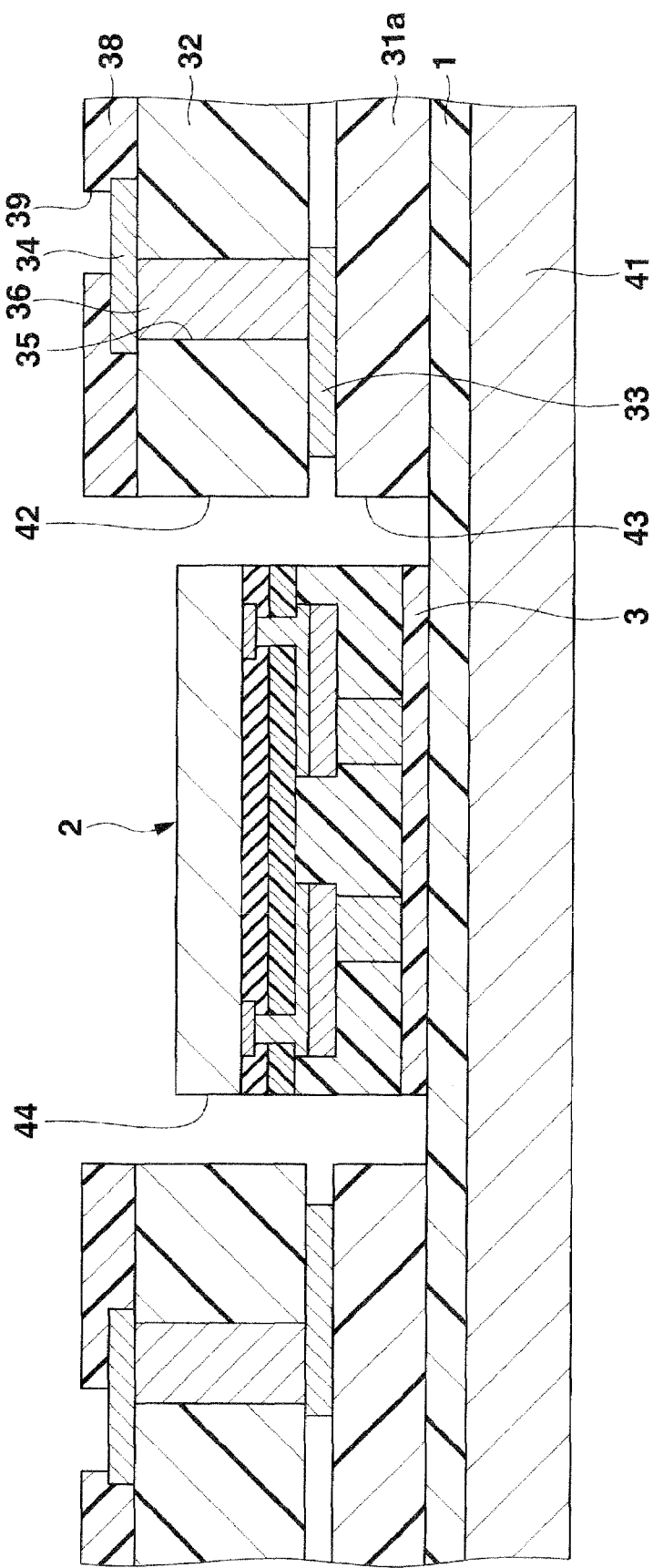
FIG. 3 is a sectional view of the assembly in a step subsequent to FIG. 2.

Then, as shown in FIG. 3, the grid-like insulating substrate 32 made of the glass cloth-based epoxy resin or the like is prepared, the substrate including the intermediate under-layer wires 33 made of the copper foil, the upper-layer wires 34 made of the copper foil, the vertical conductive portions 36 made of the conductive paste or the like and the upper-layer overcoat film 38 made of the solder resist or the like. In this case, the grid-like insulating substrate 32 is provided with a plurality of rectangular openings 42 arranged in a matrix. The thermosetting resin made of the epoxy resin or the like in the insulating substrate 32 has already been cured. The upper-layer overcoat film 38 in a portion corresponding to the connection pad portion of the upper-layer wire 34 is provided with the opening 39.

Next, a grid-like insulating layer forming sheet 31a is adsorbed, by a vacuum adsorber or the like, on the upper surface of the under-layer insulating film 1 around the semiconductor constituent 2 including the adhesive layer 3, moved on an XY-stage, positioned, and then fixed thereto. The fixing is achieved by a method of piercing the edge of the insulating layer forming sheet 31a with a pin or the like to get into the under-layer insulating film 1 through the insulating layer forming sheet 31a. To obtain the insulating layer forming sheet 31a, a base material made of glass cloth or the like is impregnated with a thermosetting resin such as the epoxy-based resin, the thermosetting resin is brought into a semi-cured state and formed into a sheet-like shape, and the thus obtained sheet is provided with a plurality of rectangular openings 43 by punching or the like. The size of the openings 42, 43 of the insulating substrate 32 and the insulating layer forming sheet 31a is slightly larger than that of the semiconductor constituent 2. Therefore, a gap 44 is formed between the insulating substrate 32 and insulating layer forming sheet 31a and the semiconductor constituent 2.

Figure 4:
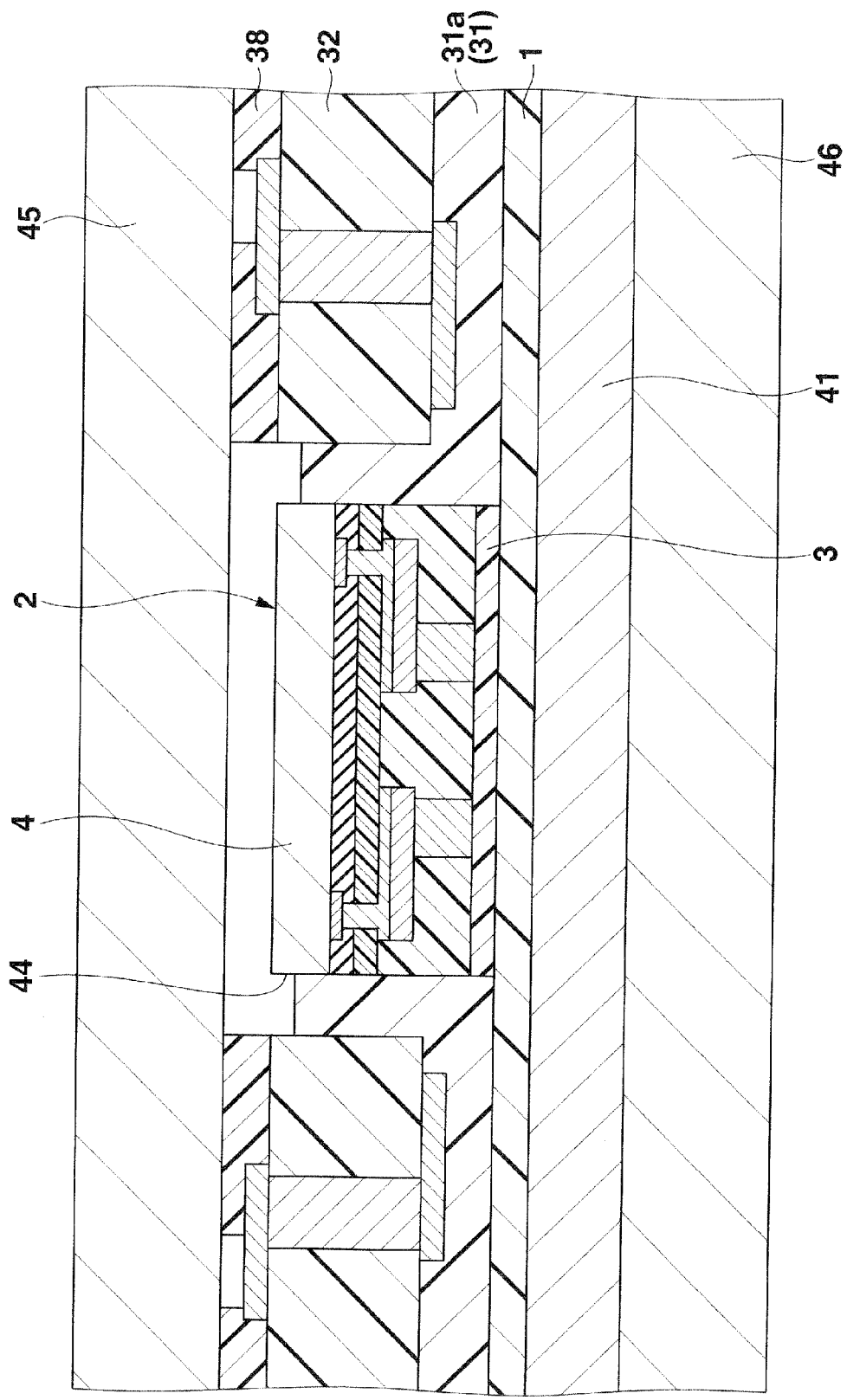
FIG. 4 is a sectional view of the assembly in a step subsequent to FIG. 3.

Then, as shown in FIG. 4, the insulating layer forming sheet 31a is vertically heated and pressurized using a pair of heating/pressurizing plates 45, 46. Through this heating/pressurizing, the thermosetting resin in the insulating layer forming sheet 31a flows to fill in the gap 44, and then cured by cooling to form the insulating layer 31 on the upper surface of the under-layer insulating film 1 around the semiconductor constituent 2 including the adhesive layer 3. Moreover, the grid-like insulating substrate 32 is embedded in the upper surface of the insulating layer 31.

In this case, the thermosetting resin as the main component of the under-layer insulating film 1 and insulating substrate 32 is beforehand cured, so that the under-layer insulating film and the insulating substrate are hardly deformed even when heated and pressurized. The upper-layer overcoat film 38 made of the solder resist or the like is hardly deformed. Here, it is preferable that the upper surface of the insulating layer 31 formed between the semiconductor constituent 2 and the insulating substrate 32 is disposed in the same position as that of the upper surface of the silicon substrate 4 of the semiconductor constituent 2 or disposed in a position slightly below the upper surface of the silicon substrate. That is, it is preferable that the insulating layer 31 is not formed on the upper surface of the silicon substrate 4 of the semiconductor constituent 2.

Figure 5:
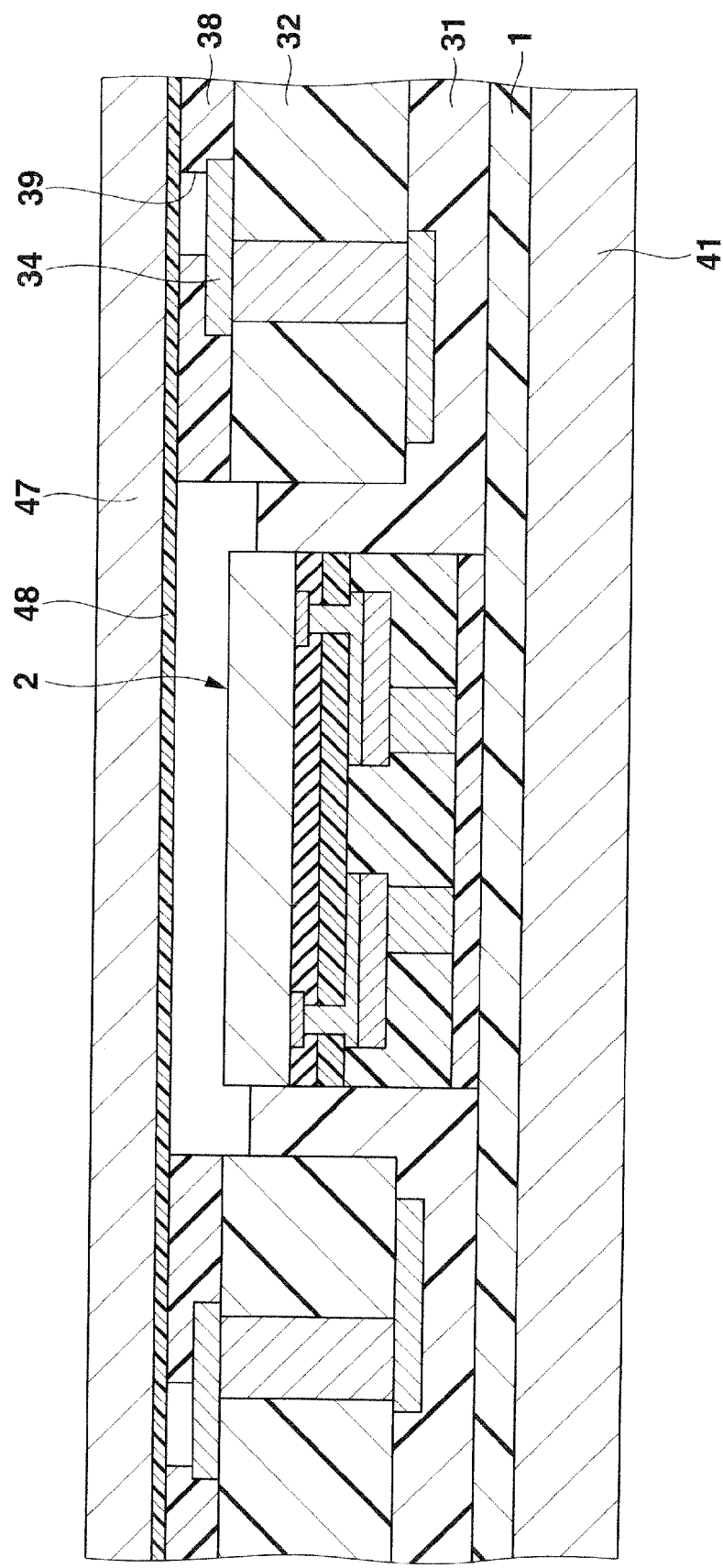
FIG. 5 is a sectional view of the assembly in a step subsequent to FIG. 4.
Figure 6:
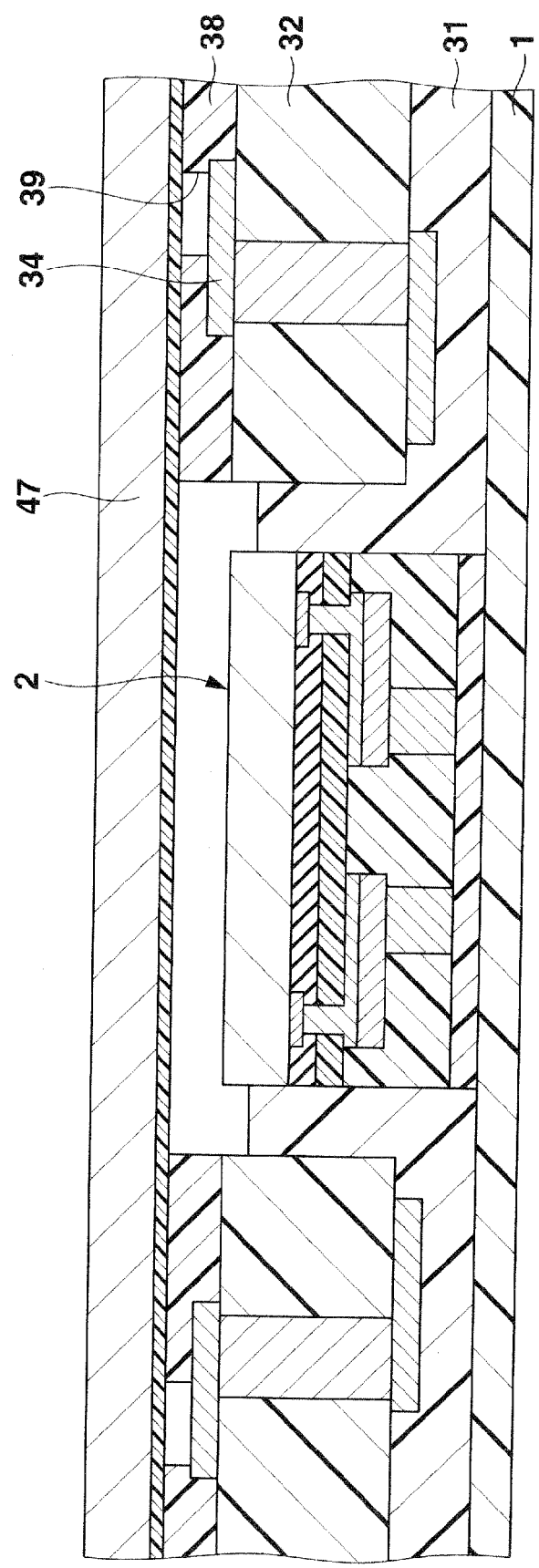
FIG. 6 is a sectional view of the assembly in a step subsequent to FIG. 5.

Then, as shown in FIG. 5, to protect the connection pad portion of the upper-layer wire 34 exposed through the opening 39 of the upper-layer overcoat film 38, a protective film 47 is attached to the upper surface of the upper-layer overcoat film 38 via an adhesive layer 48 provided on the under surface of the film. Next, when the base plate 41 is removed by wet etching of using an etching solution, as shown in FIG. 6, the under surface of the under-layer insulating film 1 is exposed. In this case, the connection pad portion of the upper-layer wire 34 exposed through the opening 39 of the upper-layer overcoat film 38 is covered with the protective film 47 and hence is not etched. Then, in this state, the under-layer insulating film 1, the insulating layer 31 and the insulating substrate 32 are cured. Therefore, even when the base plate 41 is removed, strength can sufficiently be secured.

Figure 7:
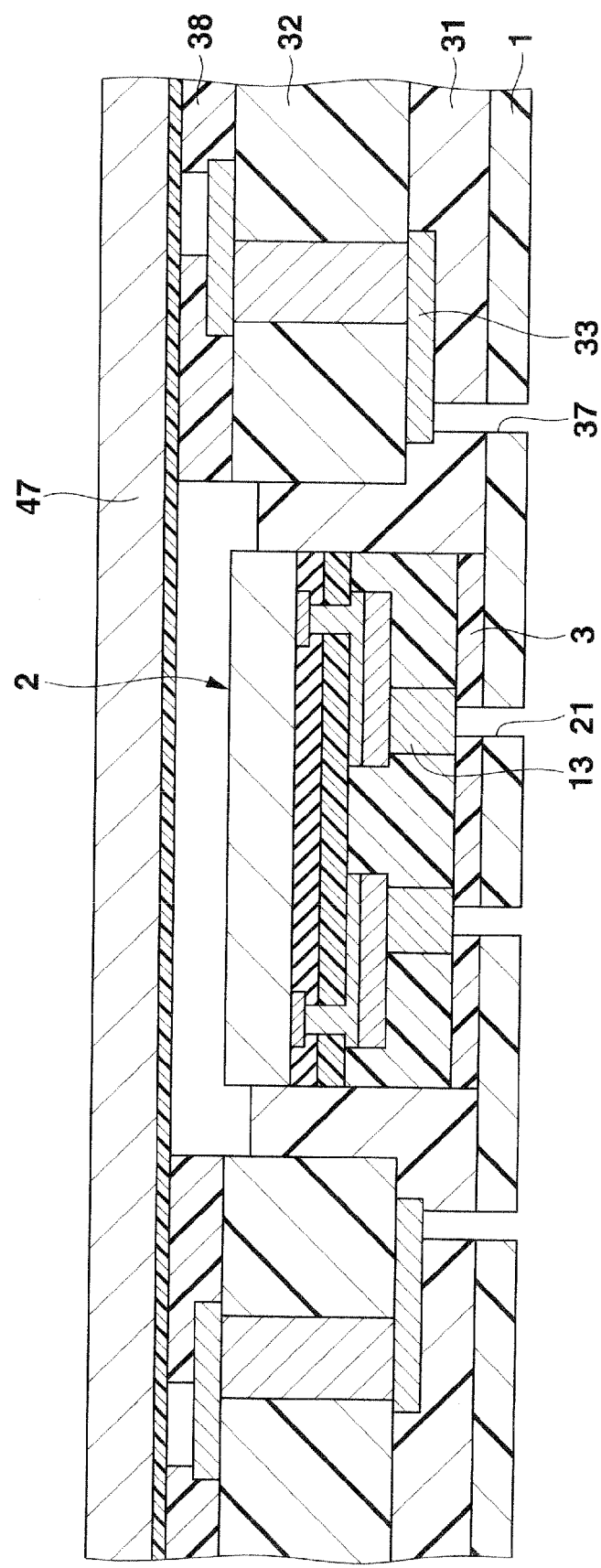
FIG. 7 is a sectional view of the assembly in a step subsequent to FIG. 6.

Next, as shown in FIG. 7, the under-layer insulating film 1 and the adhesive layer 3 in a portion corresponding to the center of the under surface of the columnar electrode 13 of the semiconductor constituent 2 are irradiated with a laser beam and thus provided with the opening 21 by laser processing. Moreover, the under-layer insulating film 1 and the insulating layer 31 in a portion corresponding to the connection pad portion of the intermediate under-layer wire 33 are irradiated with the laser beam and thus provided with the opening 37 by the laser processing.

Figure 8:
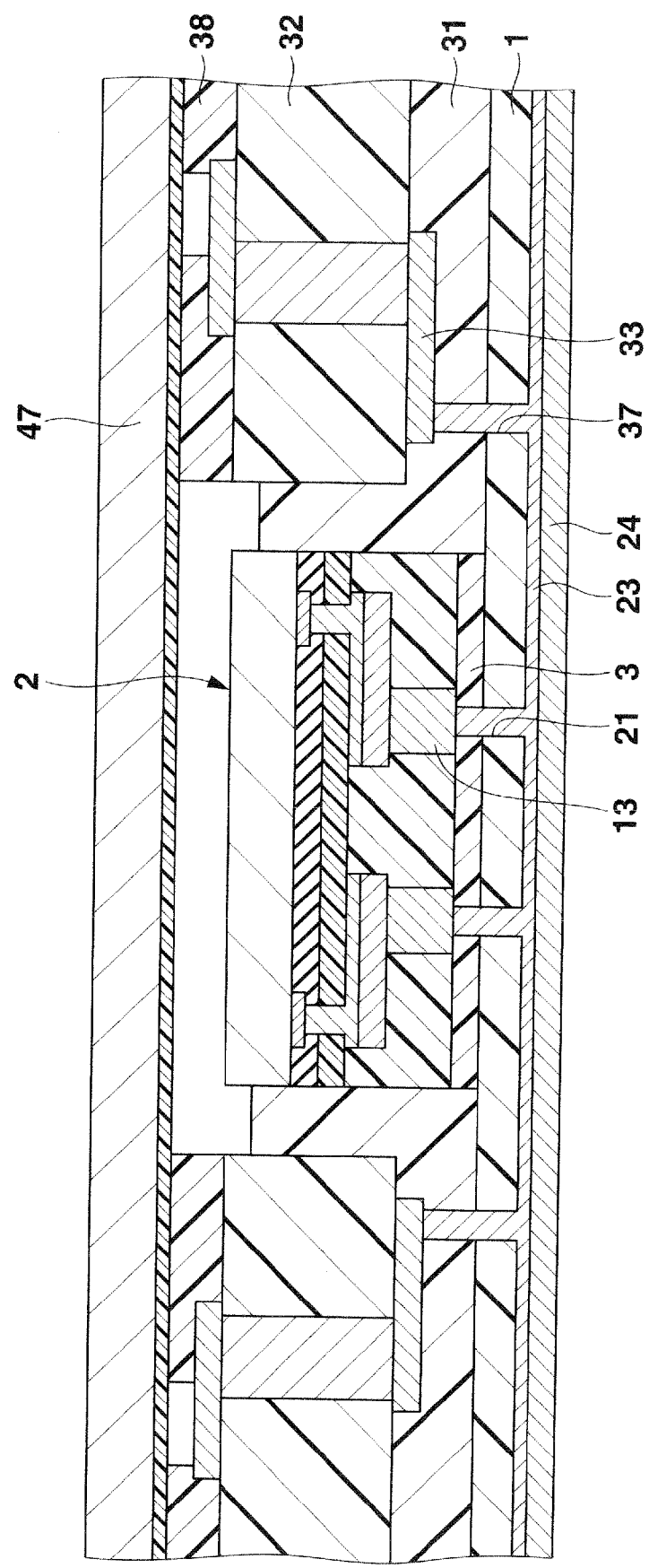
FIG. 8 is a sectional view of the assembly in a step subsequent to FIG. 7.

Then, as shown in FIG. 8, the base metal layer 23 is formed, by the electroless plating of copper, on the whole under surface of the under-layer insulating film 1 including the under surfaces of the columnar electrodes 13 of the semiconductor constituent 2 exposed through the openings 21 of the under-layer insulating film 1 and the adhesive layer 3 and the under surfaces of the connection pad portions of the intermediate under-layer wires 33 exposed through the openings 37 of the under-layer insulating film 1 and insulating layer 31. Next, the electrolytic plating of copper is performed using the base metal layer 23 as a plating current path to form the lower metal layer 24 on the under surface of the base metal layer 23.

Figure 9:
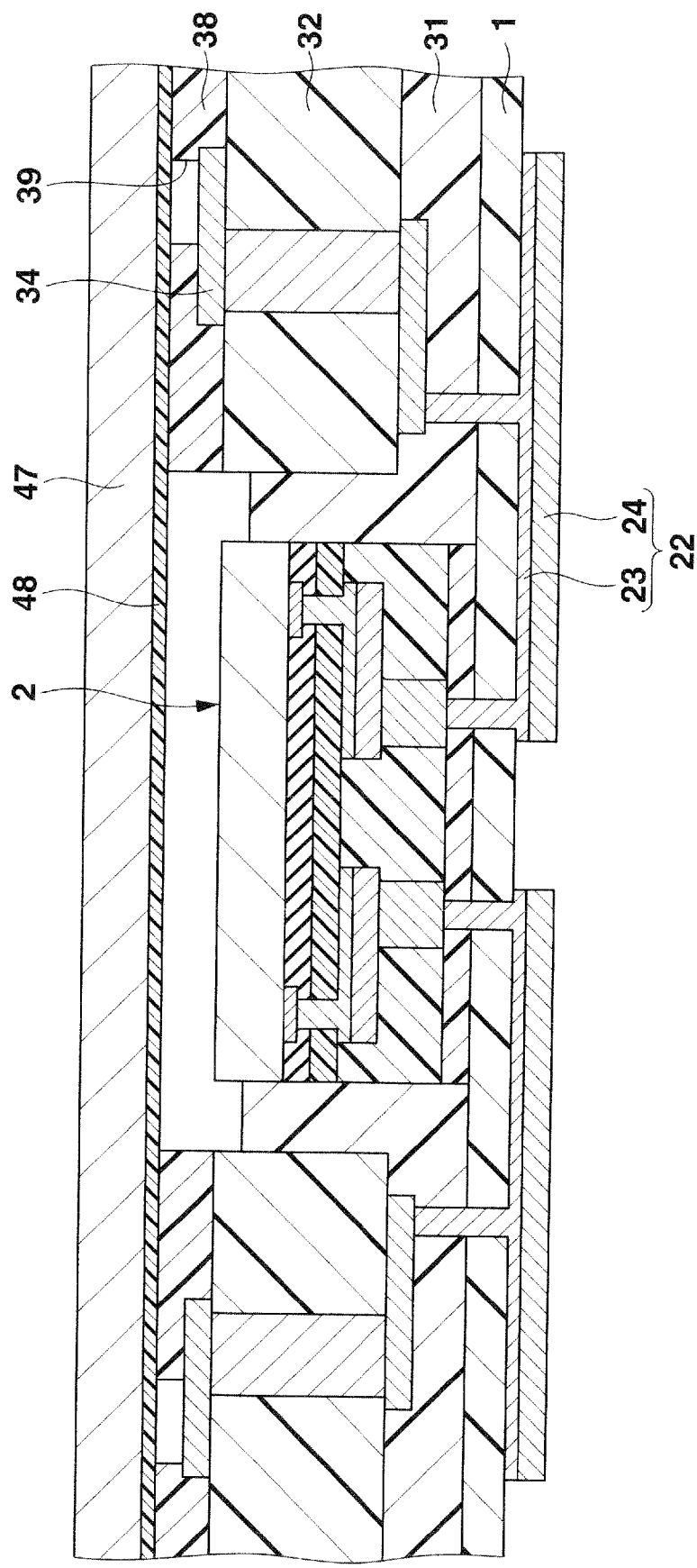
FIG. 9 is a sectional view of the assembly in a step subsequent to FIG. 8.

Next, the lower metal layer 24 and the base metal layer 23 are patterned by a photolithography process as shown in FIG. 9. That is, the under-layer wire 22 having the double-layer structure including the base metal layer 23 and the lower metal layer 24 is formed on the under surface of the under-layer insulating film 1. In this case, the connection pad portions of the upper-layer wires 34 exposed through the openings 39 of the upper-layer overcoat film 38 are covered with the protective film 47, and hence are not etched. Then, the protective film 47 including the adhesive layer 48 is peeled.

Figure 10:
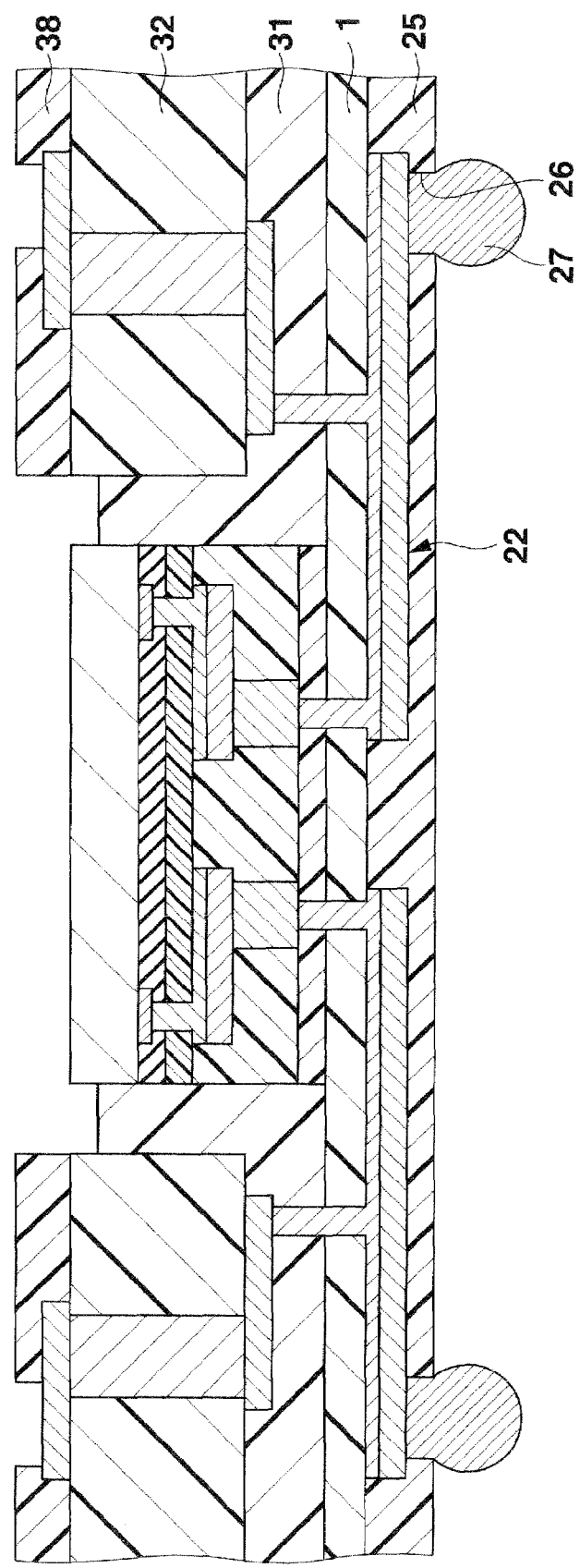
FIG. 10 is a sectional view of the assembly in a step subsequent to FIG. 9.

Then, as shown in FIG. 10, the under-layer overcoat film 25 made of the solder resist or the like is formed on the under surface of the under-layer insulating film 1 including the under-layer wire 22 by a screen printing process, a spin coating process or the like. Next, the portion of the under-layer overcoat film 25 corresponding to the connection pad portion of the under-layer wire 22 is irradiated with the laser beam and thus provided with the opening 26 by the laser processing.

Next, the solder ball 27 is connected to the connection pad portion of the under-layer wire 22 and formed in and under the opening 26 of the under-layer overcoat film 25. Next, when the under-layer overcoat film 25, the under-layer insulating film 1, the insulating layer 31, the insulating substrate 32 and the upper-layer overcoat film 38 are cut between the semiconductor constituents 2 disposed adjacent to each other, a plurality of semiconductor devices shown in FIG. 1 are obtained.

In the semiconductor device obtained in this manner, the under-layer wires 22 are connected to the columnar electrodes 13 of the semiconductor constituent 2 under the semiconductor constituent 2 and under the under-layer insulating film 1 provided around the semiconductor constituent. Therefore, the arrangement region of the solder balls (the electrodes for external connection) 27 can be set to a size larger than the planar size of the semiconductor constituent 2, and additionally the base plate 41 is not disposed, so that the device can be thinned. It is to be noted that the base plate 41 may be formed of another metal such as aluminum.

In this semiconductor device, the upper-layer wire 34 is provided on the upper surface of the rectangular frame-like insulating substrate 32 arranged around the semiconductor constituent 2. In this case, any upper-layer insulating film is not disposed, and the device can further be thinned, as compared with a case where the upper-layer insulating film is provided on the side of the upper surface of the semiconductor constituent 2 and the upper-layer wire is provided on the upper surface of this upper-layer insulating film.

Figure 11:
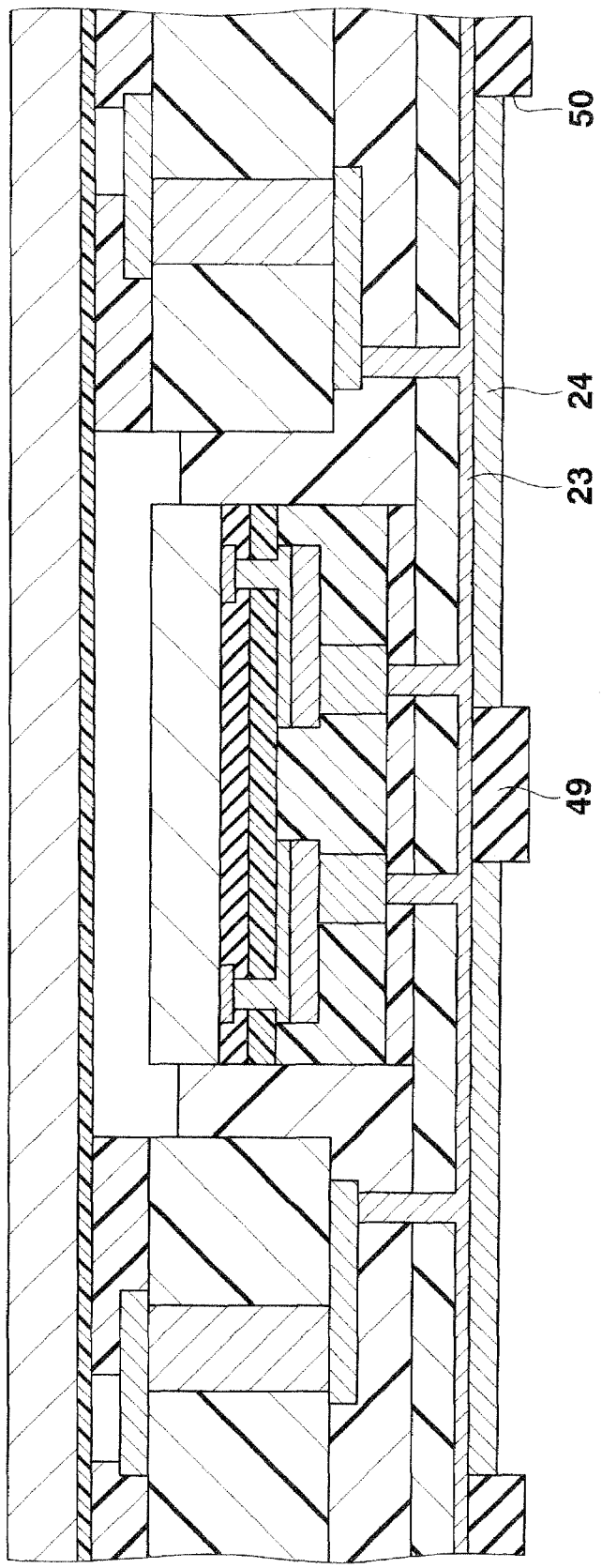
FIG. 11 is a sectional view of an assembly for explaining a predetermined step in another example of the manufacturing method of the semiconductor device shown in FIG. 1.

In the step shown in FIG. 8, the base metal layer 23 is formed, and then a step shown in FIG. 11 may be performed. That is, a plating resist film 49 is formed on the under surface of the base metal layer 23 by patterning. In this case, the portion of the plating resist film 49 corresponding to a region where the lower metal layer 24 is to be formed is provided with an opening 50.

Next, the electrolytic plating of copper is performed using the base metal layer 23 as the plating current path, whereby the lower metal layer 24 is formed on the under surface of the base metal layer 23 in the opening 50 of the plating resist film 49. Next, when the plating resist film 49 is peeled and then the unnecessary portion of the base metal layer 23 is etched and removed using the lower metal layer 24 as a mask, as shown in FIG. 9, the base metal layer 23 is left only on the lower metal layer 24.

Second Embodiment

Figure 12:
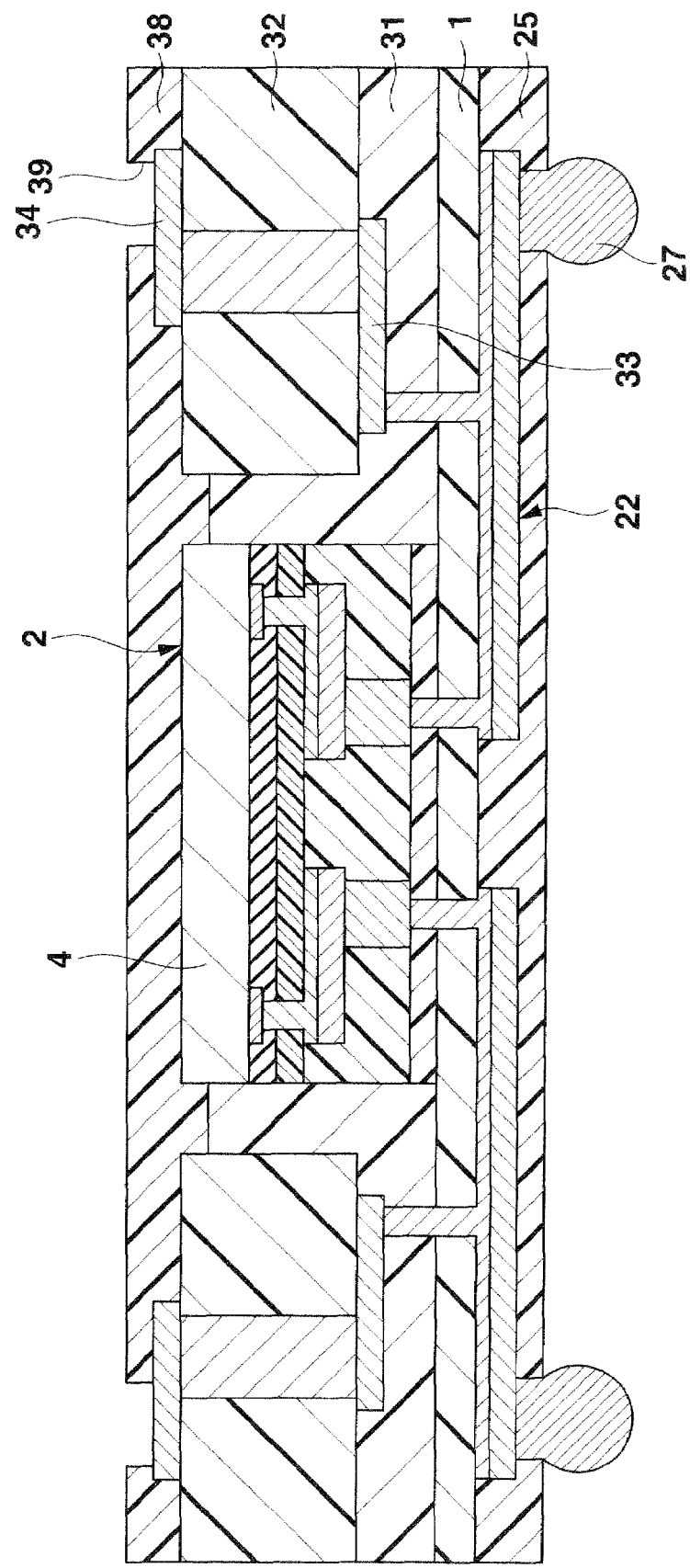
FIG. 12 is a sectional view of a semiconductor device according to a second embodiment of this invention.

FIG. 12 shows a sectional view of a semiconductor device according to a second embodiment of this invention. This semiconductor device is different from the semiconductor device shown in FIG. 1 in that an upper-layer overcoat film 38 made of a solder resist or the like is provided on the upper surface of a silicon substrate 4 of a semiconductor constituent 2, the upper surface of an insulating substrate 32 including an upper-layer wire 34 and the upper surface of an insulating layer 31 between the substrates. Also in this case, the portion of the upper-layer overcoat film 38 corresponding to the connection pad portion of the upper-layer wire 34 is provided with an opening 39.

Next, one example of a manufacturing method of his semiconductor device will briefly be described. First, in a step shown in FIG. 4, the upper-layer overcoat film 38 is not formed on the upper surface of the insulating substrate 32.

Then, as shown in a step shown in FIG. 5, a protective film 47 is attached to the upper surface of the insulating substrate 32 including the upper-layer wire 34 via an adhesive layer 48 provided on the under surface of the film. Next, in a step shown in FIG. 9, a wire 22 is formed, and then the protective film 47 including the adhesive layer 48 is peeled. Then, in a step shown in FIG. 10, an under-layer overcoat film 25 is formed, and the upper-layer overcoat film 38 shown in FIG. 12 is formed.

Thus, in this manufacturing method of the semiconductor device, the upper-layer overcoat film 38 is formed substantially simultaneously with the forming of the under-layer overcoat film 25 immediately before forming a solder ball 27. Therefore, the upper-layer overcoat film 38 may be formed as shown in FIG. 12 or 1. When the upper-layer overcoat film 38 is formed as shown in FIG. 12, the upper surface of the silicon substrate 4 of the semiconductor constituent 2 can be protected from breakage, contamination or the like in an outside atmosphere.

Third Embodiment

Figure 13:
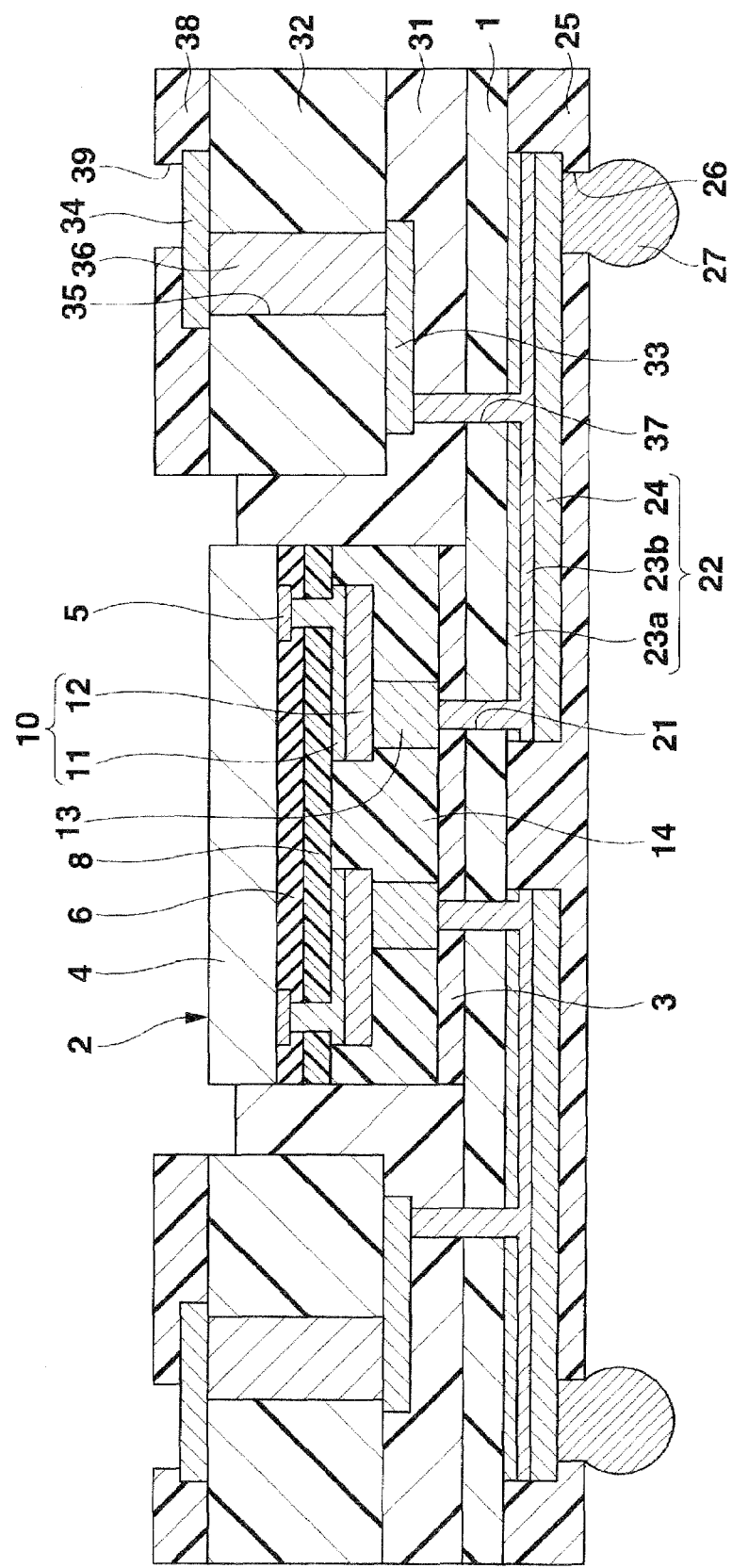
FIG. 13 is a sectional view of a semiconductor device according to a third embodiment of this invention.

FIG. 13 shows a sectional view of a semiconductor device according to a third embodiment of this invention. This semiconductor device is different from the semiconductor device shown in FIG. 1 in that an under-layer wire 22 is formed into a three-layer structure including a first base metal layer 23a made of a copper based metal, a second base metal layer 23b made of a copper based metal and a lower metal layer 24 made of a copper based metal. In this case, the first base metal layer 23a, an under-layer insulating film 1 and an adhesive layer 3 in portions corresponding to the centers of the under surfaces of columnar electrodes 13 of the semiconductor constituent 2 are provided with openings 21.

Figure 14:
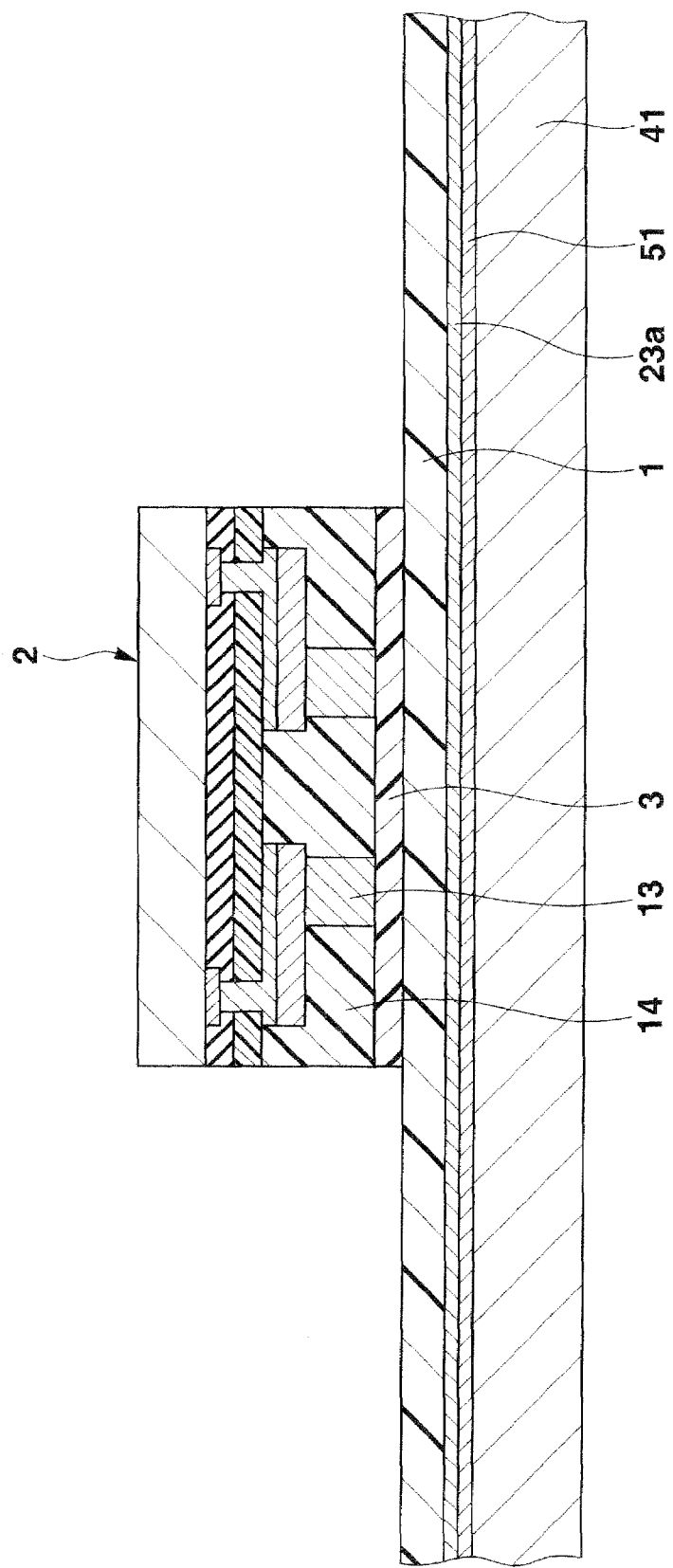
FIG. 14 is a sectional view of an assembly in an initial step according to one example of a manufacturing method of the semiconductor device shown in FIG. 13.

Next, one example of a manufacturing method of this semiconductor device will be described. First, as shown in FIG. 14, an assembly is prepared in which the upper surface of a base plate 41 made of a copper based metal is provided with a protective metal layer 51 made of a nickel based metal and obtained by electroless plating, the first base metal layer 23a obtained by electroless copper plating, and the under-layer insulating film 1 made of an epoxy-based resin, a polyimide-based resin, a glass cloth-based epoxy resin or the like. Also in this case, the size of the thus prepared assembly is such a size that a plurality of semiconductor devices completed as shown in FIG. 13 can be formed. Moreover, a thermosetting resin made of the epoxy-based resin or the like in the under-layer insulating film 1 has already been cured.

Here, to improve close contact properties between the upper surface of the first base metal layer 23a and the under-layer insulating film 1 made of a material including the resin formed on the upper surface of the first base metal layer, the upper surface is beforehand subjected to a coarse surface forming treatment to form a coarse surface. This respect is largely different from the above first embodiment. Here, examples of the coarse surface forming treatment include a method of immersing the upper surface of the first base metal layer 23a in an appropriate etching solution, but this method is not restrictive.

Next, the under surfaces of the columnar electrodes 13 and sealing film 14 of a semiconductor constituent 2 are bonded to a semiconductor constituent mounting region on the upper surface of the under-layer insulating film 1 via the adhesive layer 3, to mount the semiconductor constituent 2 on the region. Also in this case, an adhesive material referred to as an NCP and an adhesive sheet referred to as an NCF is beforehand supplied to the semiconductor constituent mounting region on the upper surface of the under-layer insulating film 1, and the semiconductor constituent 2 is secured to the under-layer insulating film 1 by heating and pressing.

Figure 15:
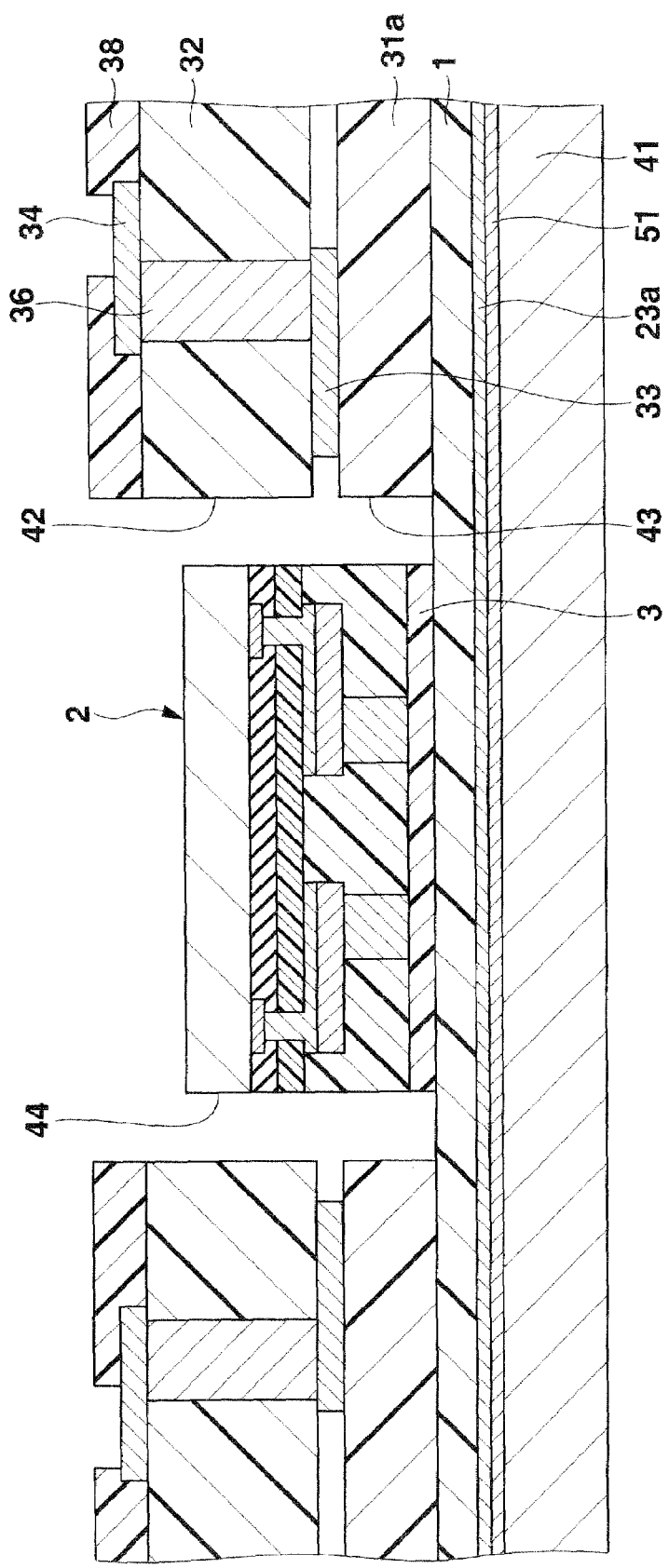
FIG. 15 is a sectional view of the assembly in a step subsequent to FIG. 14.

Then, as shown in FIG. 15, a grid-like insulating layer forming sheet 31a and a grid-like insulating substrate 32 are positioned with a pin and the like when arranged on the upper surface of the under-layer insulating film 1 around the adhesive layer 3 and the semiconductor constituent 2. Also in this case, to obtain the insulating layer forming sheet 31a, a base material made of glass cloth or the like is impregnated with a thermosetting resin such as the epoxy-based resin, the thermosetting resin is brought into a half cured state and formed into a sheet-like shape, and a plurality of rectangular openings 43 are formed by punching or the like.

The insulating substrate 32 is provided with an intermediate under-layer wire 33, an upper-layer wire 34, a vertical conductive portion 36 and an upper-layer overcoat film 38. The size of openings 42 and the openings 43 of the insulating substrate 32 and the insulating layer forming sheet 31a is slightly larger than that of the semiconductor constituent 2. Therefore, a gap 44 is formed between the insulating substrate 32 and insulating layer forming sheet 31a and the semiconductor constituent 2.

Figure 16:
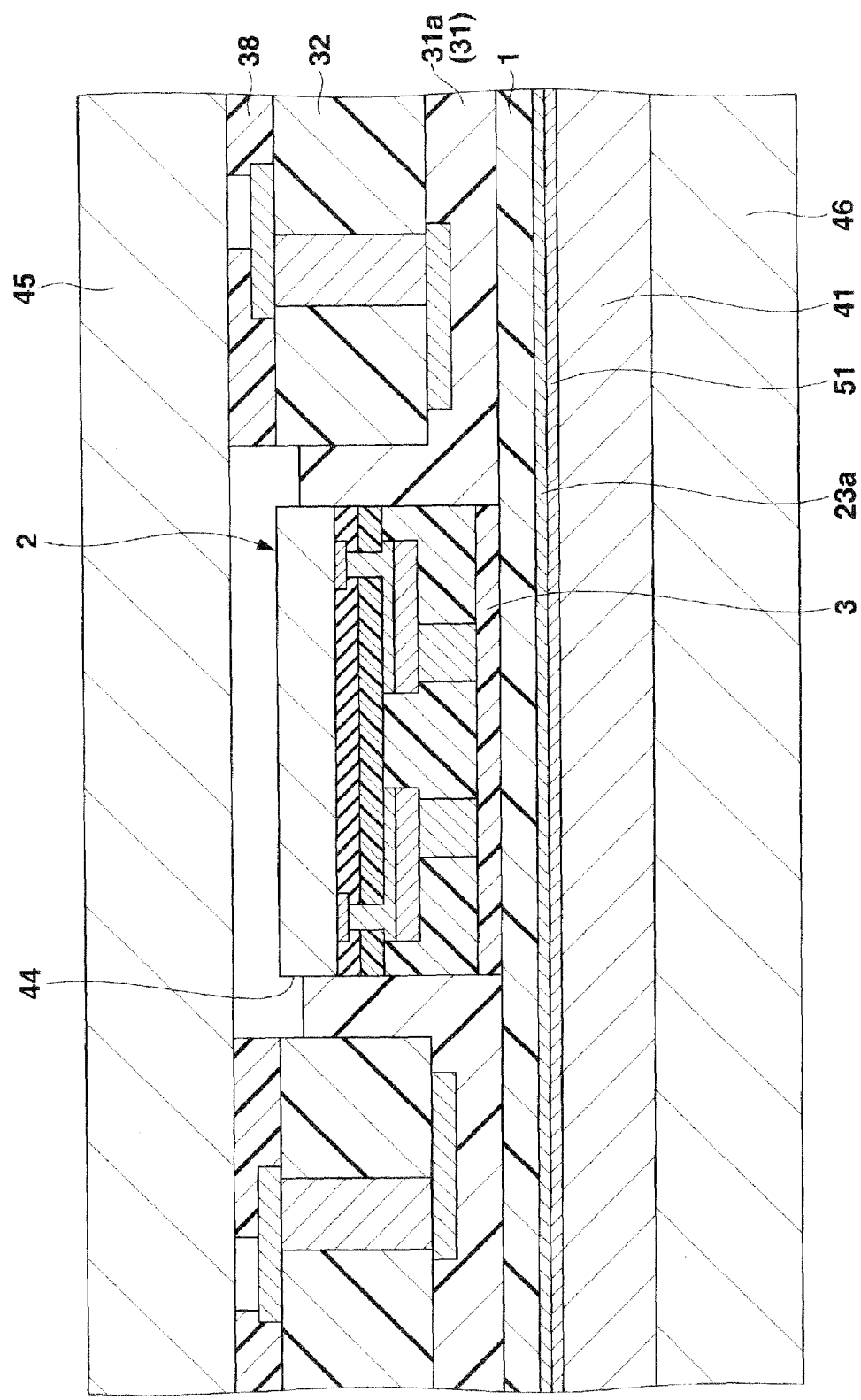
FIG. 16 is a sectional view of the assembly in a step subsequent to FIG. 15.

Next, as shown in FIG. 16, the insulating layer forming sheet 31a is vertically heated and pressurized using a pair of heating/pressurizing plates 45, 46. Through this heating/pressurizing, the thermosetting resin in the insulating layer forming sheet 31a flows to fill in the gap 44, and then cured by cooling to form an insulating layer 31 on the upper surface of the under-layer insulating film 1 around the semiconductor constituent 2 including the adhesive layer 3. Moreover, the insulating substrate 32 is embedded in the upper surface of the insulating layer 31.

Figure 17:
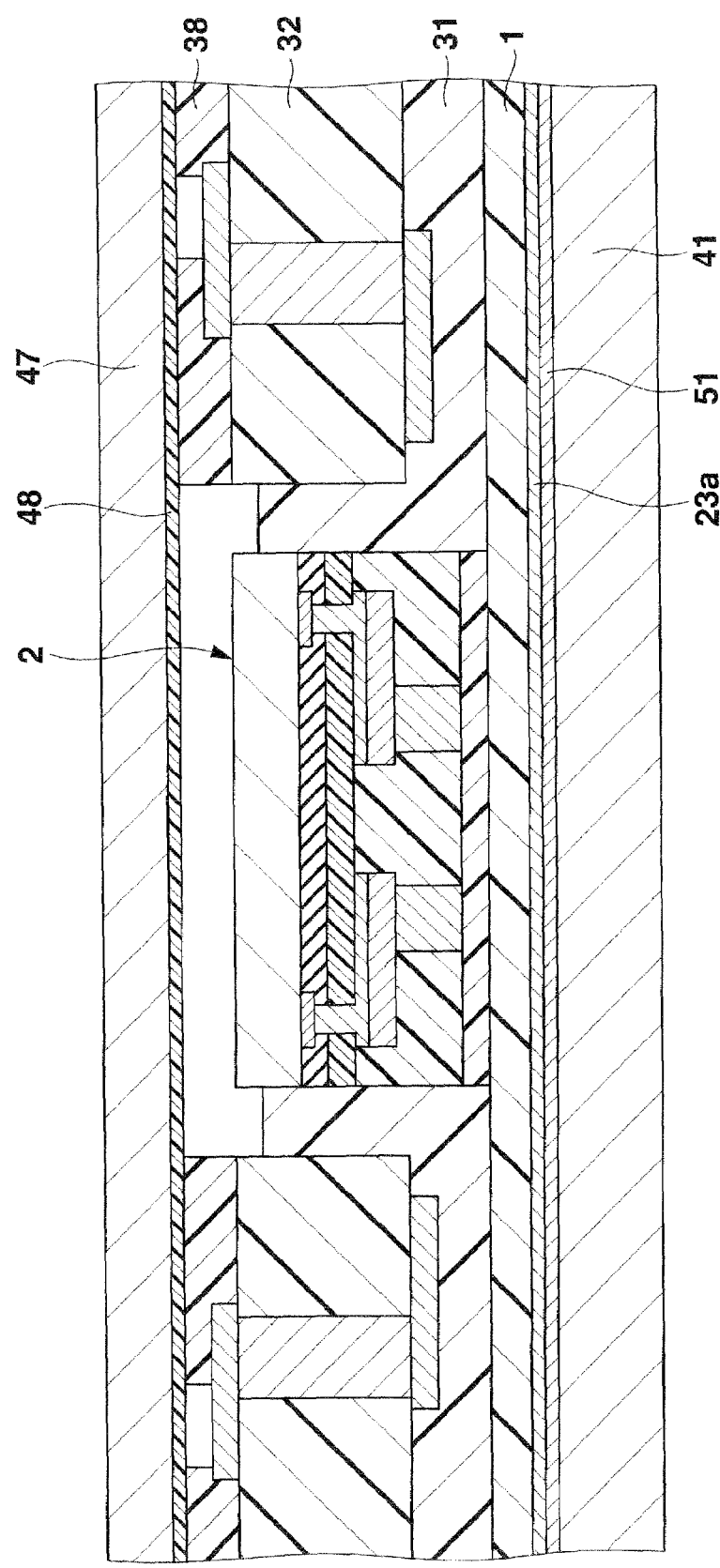
FIG. 17 is a sectional view of the assembly in a step subsequent to FIG. 16.
Figure 18:
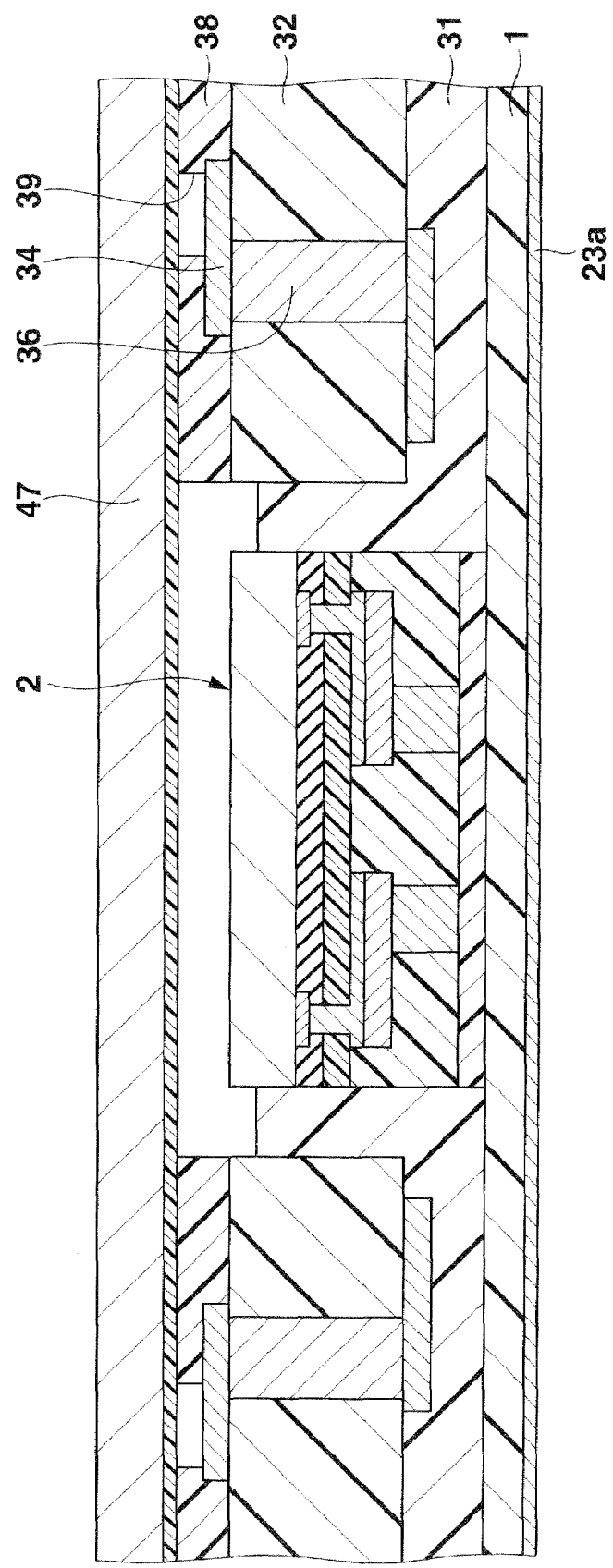
FIG. 18 is a sectional view of the assembly in a step subsequent to FIG. 17.

Then, as shown in FIG. 17, a protective film 47 is attached to the upper surface of the upper-layer overcoat film 38 via an adhesive layer 48 provided on the under surface of the film. Next, when the base plate 41 and the protective metal layer 51 are continuously removed by etching, as shown in FIG. 18, the under surface of the first base metal layer 23a is exposed. In this case, the connection pad portion of the upper-layer wire 34 exposed through the opening 39 of the upper-layer overcoat film 38 is covered with the protective film 47 and hence is not etched. Moreover, when the base plate 41 made of copper is removed by the etching, the protective metal layer 51 made of nickel protects the first base metal layer 23a similarly made of copper so that the first base metal layer is not etched. Then, in this state, even when the base plate 41 and the protective metal layer 51 are removed, the under-layer insulating film 1, the insulating layer 31 and the insulating substrate 32 are present, so that strength can sufficiently be secured.

Figure 19:
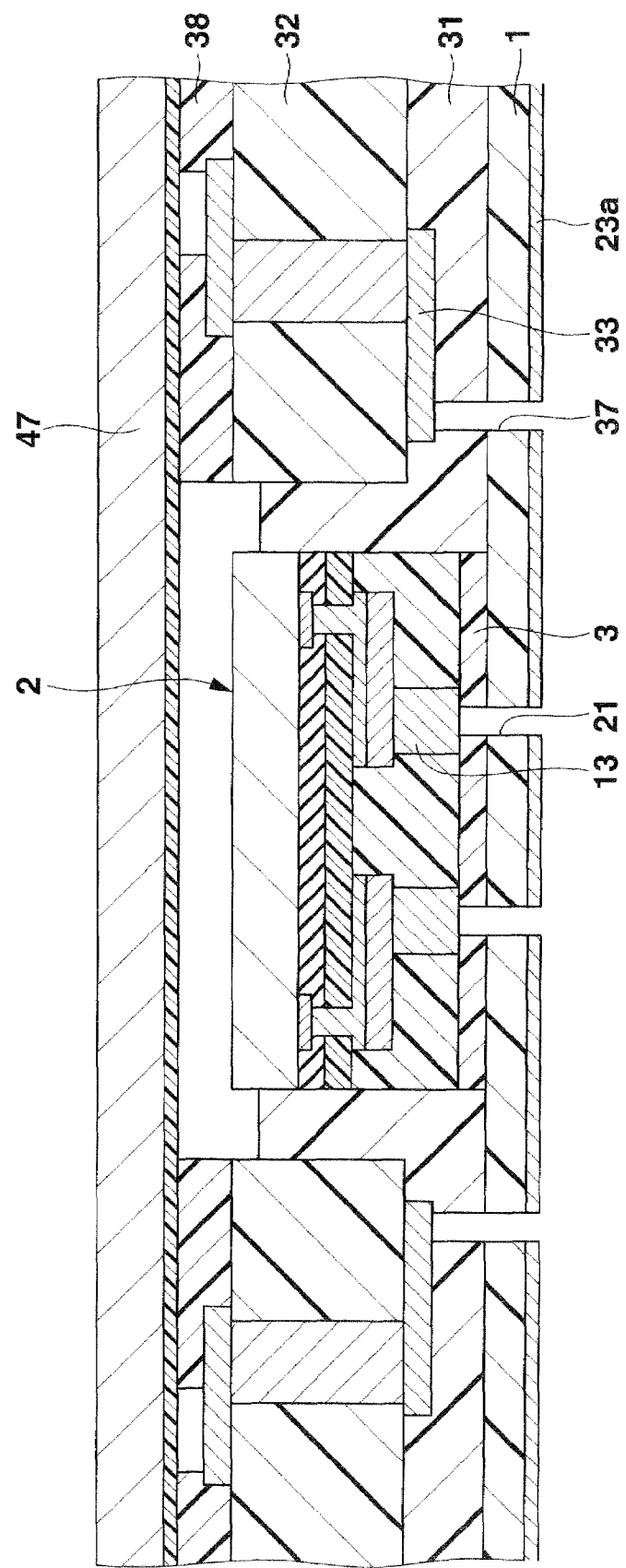
FIG. 19 is a sectional view of the assembly in a step subsequent to FIG. 18.

Next, as shown in FIG. 19, the first base metal layer 23a, the under-layer insulating film 1 and the adhesive layer 3 in the portions corresponding to the centers of the under surfaces of the columnar electrodes 13 of the semiconductor constituent 2 are irradiated with a laser beam and thus provided with the openings 21 by laser processing. Moreover, the first base metal layer 23a, the under-layer insulating film 1 and the insulating layer 31 in a portion corresponding to the connection pad portion of the intermediate under-layer wire 33 are irradiated with the laser beam and thus provided with an opening 37 by the laser processing.

Figure 20:
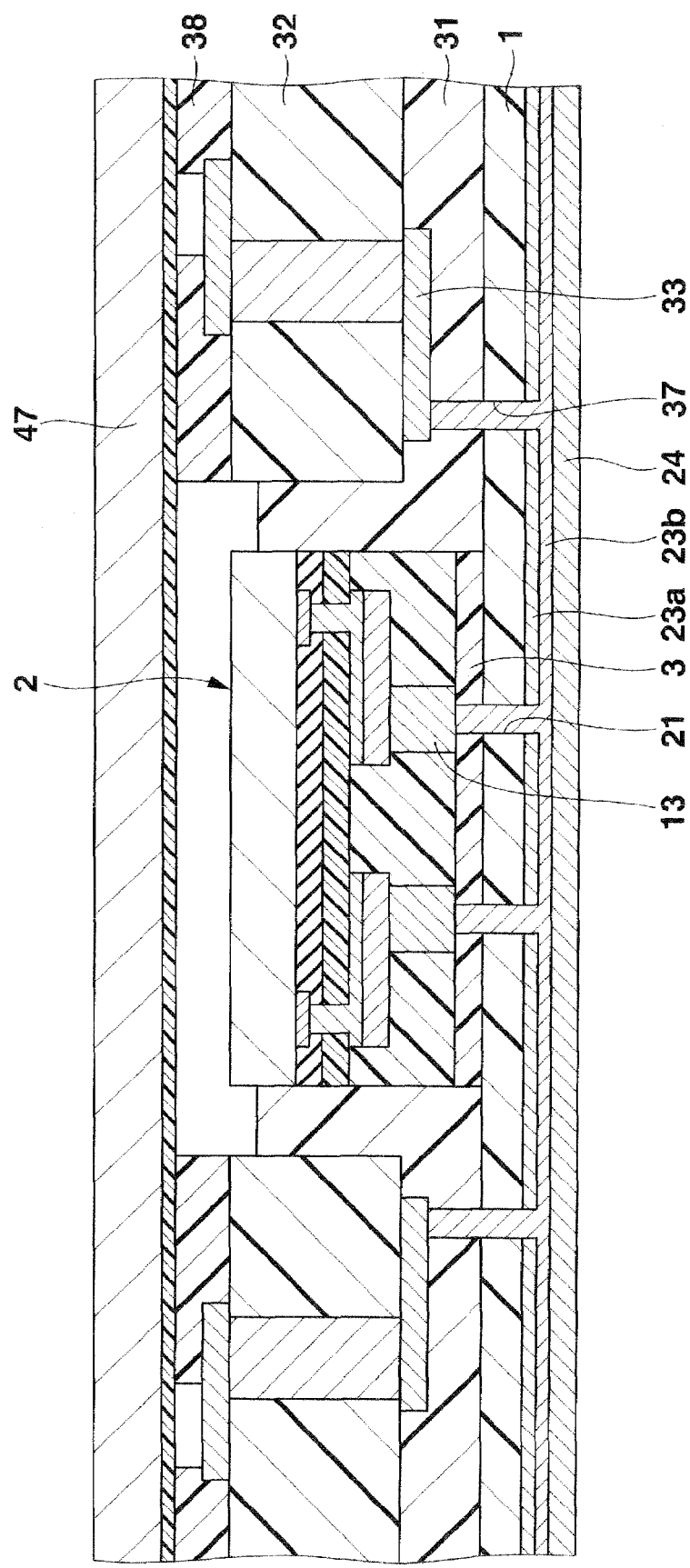
FIG. 20 is a sectional view of the assembly in a step subsequent to FIG. 19.

Then, as shown in FIG. 20, the second base metal layer 23b is formed, by electroless plating of copper, all over the under surface of the first base metal layer 23a including both of the under surfaces of the columnar electrodes 13 of the semiconductor constituent 2 exposed through the openings 21 of the first base metal layer 23a, the under-layer insulating film 1 and the adhesive layer 3, and the under surfaces of the connection pad portions of the intermediate under layer wires 33 exposed through the openings 37 of the first base metal layer 23a, the under-layer insulating film 1 and the insulating layer 31. Next, the electrolytic plating of copper is performed using the first and second base metal layers 23a, 23b as plating current paths to form the lower metal layer 24 on the under surface of the second base metal layer 23b.

Figure 21:
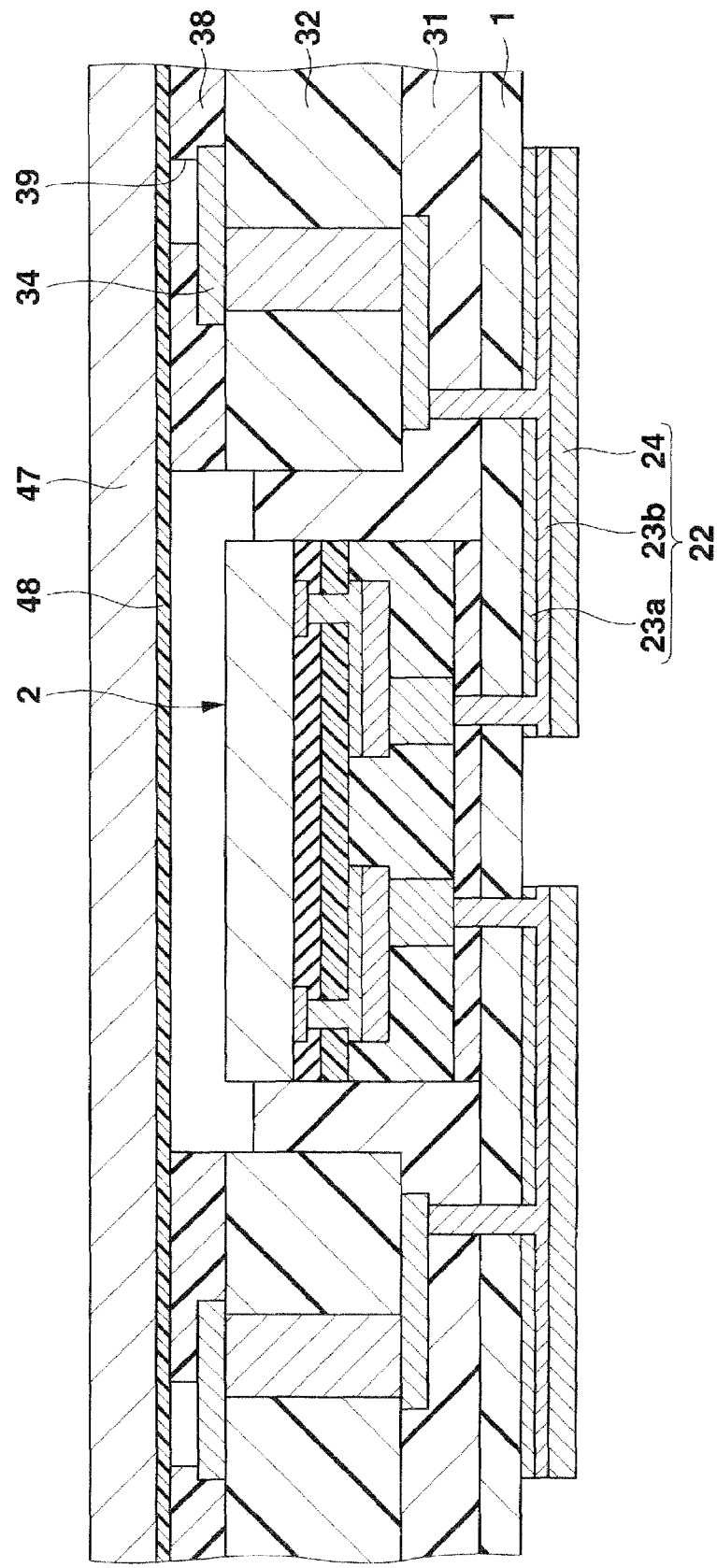
FIG. 21 is a sectional view of the assembly in a step subsequent to FIG. 20.

Next, the lower metal layer 24 and the first and second base metal layers 23a, 23b are patterned by a photolithography process to obtain such a structure as shown in FIG. 21. That is, the under-layer wire 22 having the three-layer structure including the first and second base metal layers 23a, 23b and the lower metal layer 24 is formed on the under surface of the under-layer insulating film 1. In this case, the connection pad portions of the upper-layer wires 34 exposed through the openings 39 of the upper-layer overcoat film 38 are covered with the protective film 47, and hence are not etched. Then, the protective film 47 including the adhesive layer 48 is peeled. Subsequently, through the steps similar to the above first embodiment, a plurality of semiconductor devices shown in FIG. 13 are obtained.

Fourth Embodiment

Figure 22:
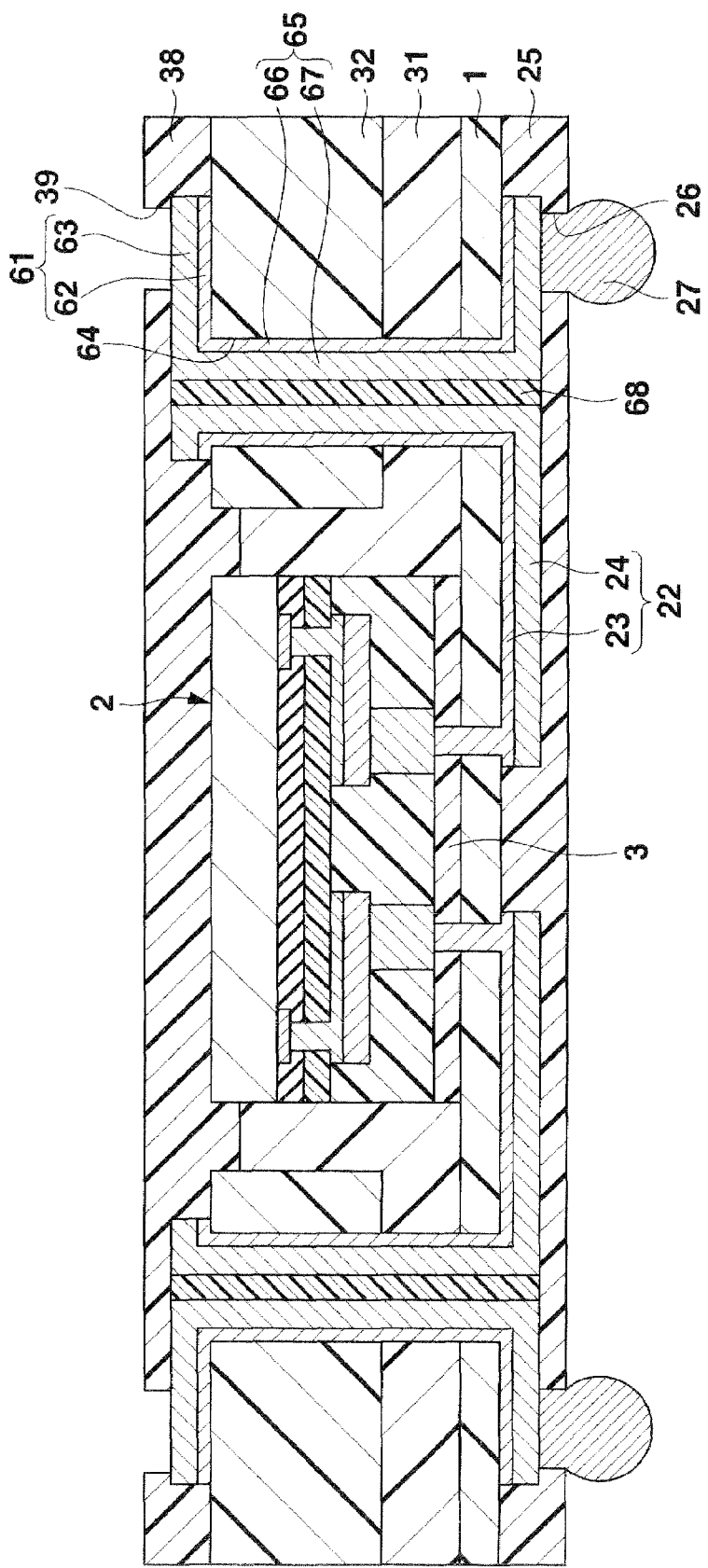
FIG. 22 is a sectional view of a semiconductor device according to a fourth embodiment of this invention.

FIG. 22 shows a sectional view of a semiconductor device according to a fourth embodiment of this invention. This semiconductor device is largely different from the semiconductor device shown in FIG. 1 in that the portion of an insulating substrate 32 is not a so-called double-sided wire structure but an upper-layer wire 61 provided on the upper surface of an insulating substrate 32 is connected to an under-layer wire 22 provided on the under surface of an under-layer insulating film 1 via a vertical conductive portion 65 provided on the inner wall surface of a through hole 64 provided through the under-layer insulating film 1, an insulating layer 31 and an insulating substrate 32.

Figure 23:
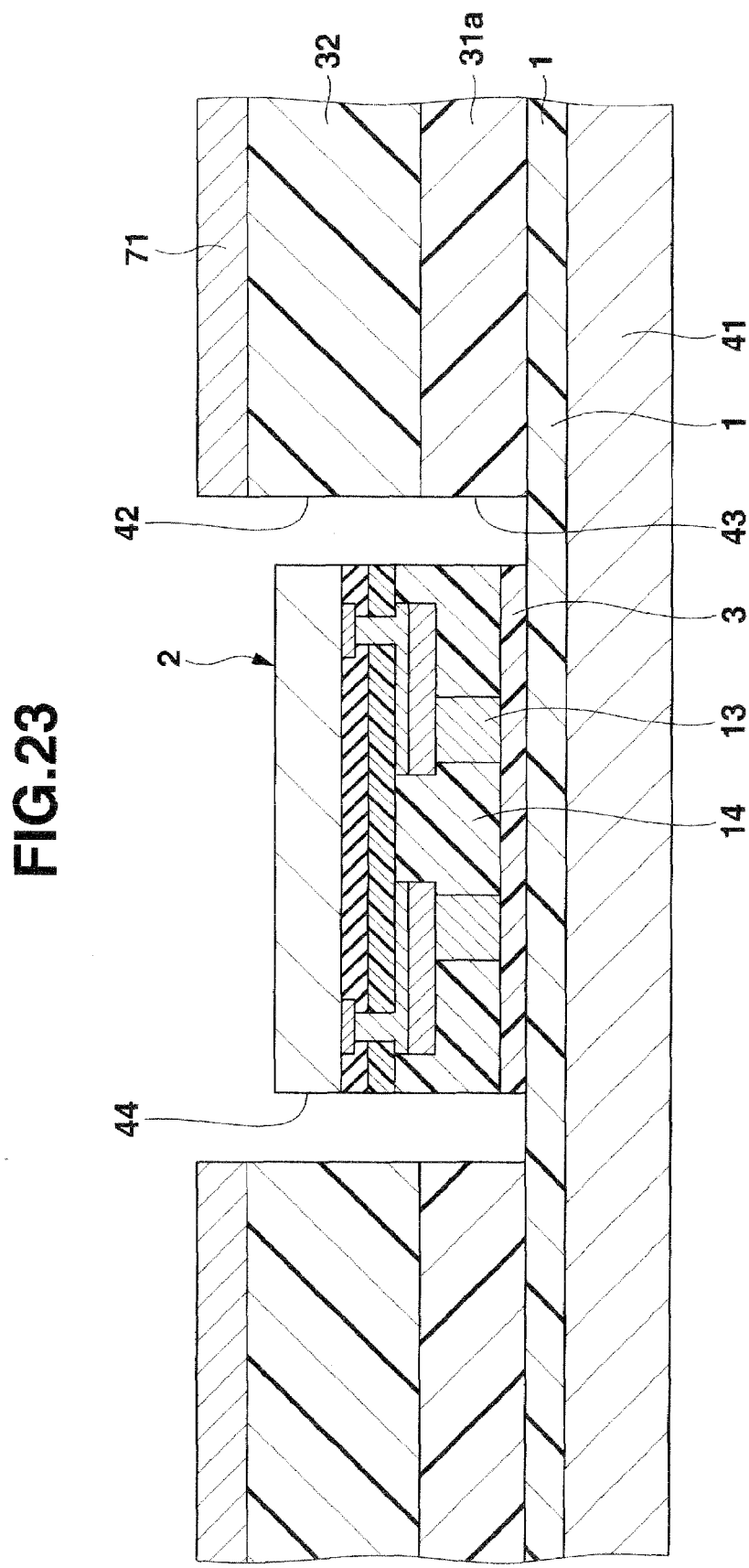
FIG. 23 is a sectional view of an assembly in an initial step according to one example of a manufacturing method of the semiconductor device shown in FIG. 22.

Next, one example of a manufacturing method of this semiconductor device will be described. First, as shown in FIG. 23, an assembly is prepared in which the upper surface of a base plate 41 made of a copper foil is provided with the under-layer insulating film 1 made of an epoxy-based resin, a polyimide-based resin, a glass cloth-based epoxy resin or the like. Also in this case, the size of the thus prepared assembly is such a size that a plurality of semiconductor devices completed as shown in FIG. 22 can be formed. Moreover, a thermosetting resin made of the epoxy-based resin or the like in the under-layer insulating film 1 has already been cured.

Next, the under surfaces of columnar electrodes 13 and a sealing film 14 of a semiconductor constituent 2 are bonded to a semiconductor constituent mounting region on the upper surface of the under-layer insulating film 1 via the adhesive layer 3, to mount the semiconductor constituent 2 on the region. Also in this case, an adhesive material referred to as an NCP is beforehand supplied to the semiconductor constituent mounting region on the upper surface of the under-layer insulating film 1 by use of a printing process, a dispenser or the like, or an adhesive sheet referred to as an NCF is beforehand supplied thereto, and the semiconductor constituent 2 is secured to the under-layer insulating film 1 by heating and pressing.

Next, a grid-like insulating layer forming sheet 31a and the grid-like insulating substrate 32 are positioned with a pin and the like when arranged on the upper surface of the under-layer insulating film 1 around the semiconductor constituent 2 including the adhesive layer 3. Also in this case, to obtain the insulating layer forming sheet 31a, a base material made of glass cloth or the like is impregnated with a thermosetting resin such as the epoxy-based resin, the thermosetting resin is brought into a half cured state and formed into a sheet-like shape, and a plurality of rectangular openings 43 are formed by punching or the like.

The size of openings 42 and the openings 43 of the insulating substrate 32 and the insulating layer forming sheet 31a is slightly larger than that of the semiconductor constituent 2. Therefore, a gap 44 is formed between the insulating substrate 32 and insulating layer forming sheet 31a and the semiconductor constituent 2. Here, the whole upper surface of the insulating substrate 32 is provided with a sub-base plate 71 made of a copper foil.

Figure 24:
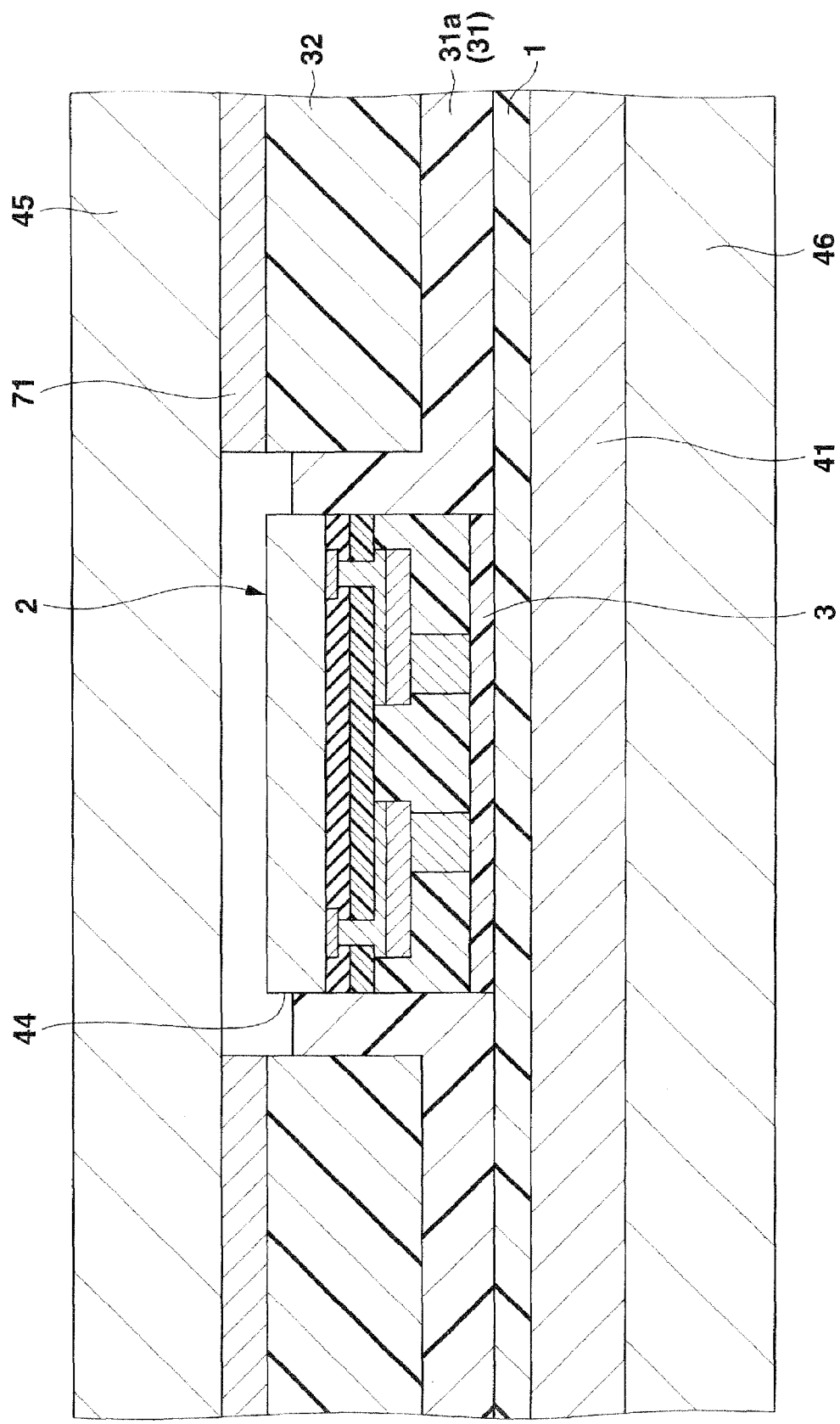
FIG. 24 is a sectional view of the assembly in a step subsequent to FIG. 23.

Next, as shown in FIG. 24, the insulating layer forming sheet 31a is vertically heated and pressurized using a pair of heating/pressurizing plates 45, 46. Through this heating/pressurizing, the thermosetting resin in the insulating layer forming sheet 31a flows to fill in the gap 44, and then cured by cooling to form the insulating layer 31 on the upper surface of the under-layer insulating film 1 around the semiconductor constituent 2 including the adhesive layer 3. Moreover, the insulating substrate 32 is embedded in the upper surface of the insulating layer 31.

Here, the insulating substrate 32 including the already cured thermosetting resin and the under-layer insulating film 1 are arranged on and under the insulating layer forming sheet 31a, respectively, and the sub-base plate 71 made of the copper foil and the base plate 41 similarly made of the copper foil are arranged on the insulating substrate and under the under-layer insulating film, respectively. Therefore, a material constitution becomes symmetrical in a thickness direction of the assembly, and warpage generated owing to the thermal contraction of the thermosetting resin in the insulating layer forming sheet 31a is decreased. As a result, conveyance to the subsequent steps and processing precision in the subsequent steps are not easily disturbed.

Figure 25:
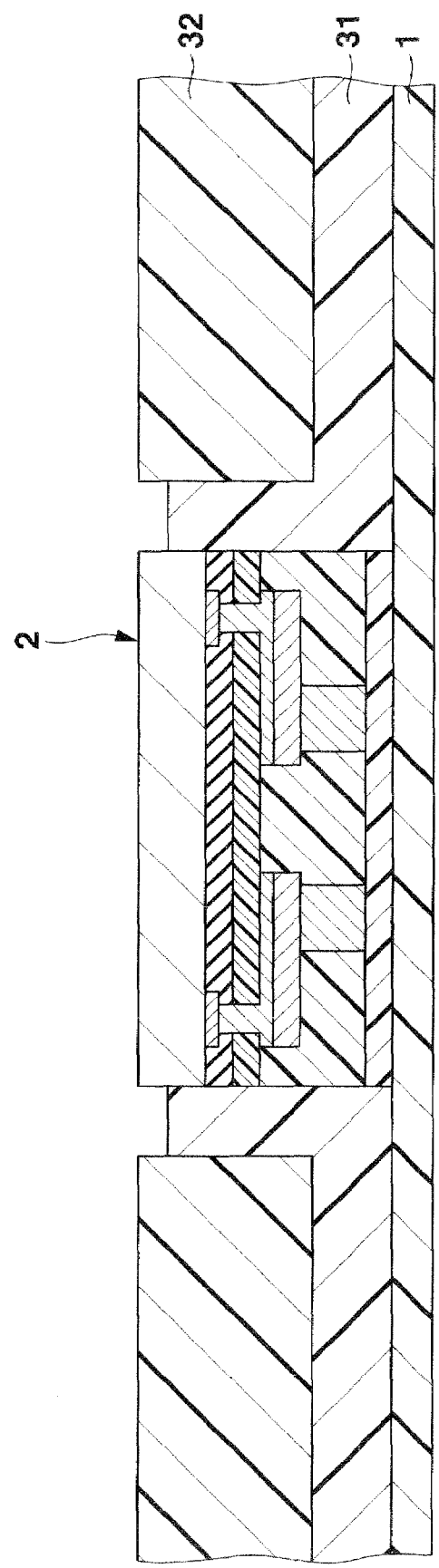
FIG. 25 is a sectional view of the assembly in a step subsequent to FIG. 24.

Next, when the base plate 41 and the sub-base plate 71 are removed by etching, as shown in FIG. 25, the under surface of the under-layer insulating film 1 is exposed, and the upper surface of the insulating substrate 32 is exposed. In this state, even when the base plate 41 and the sub-base plate 71 are removed, strength can sufficiently be secured owing to the presence of the under-layer insulating film 1, the insulating layer 31 and the insulating substrate 32.

Figure 26:
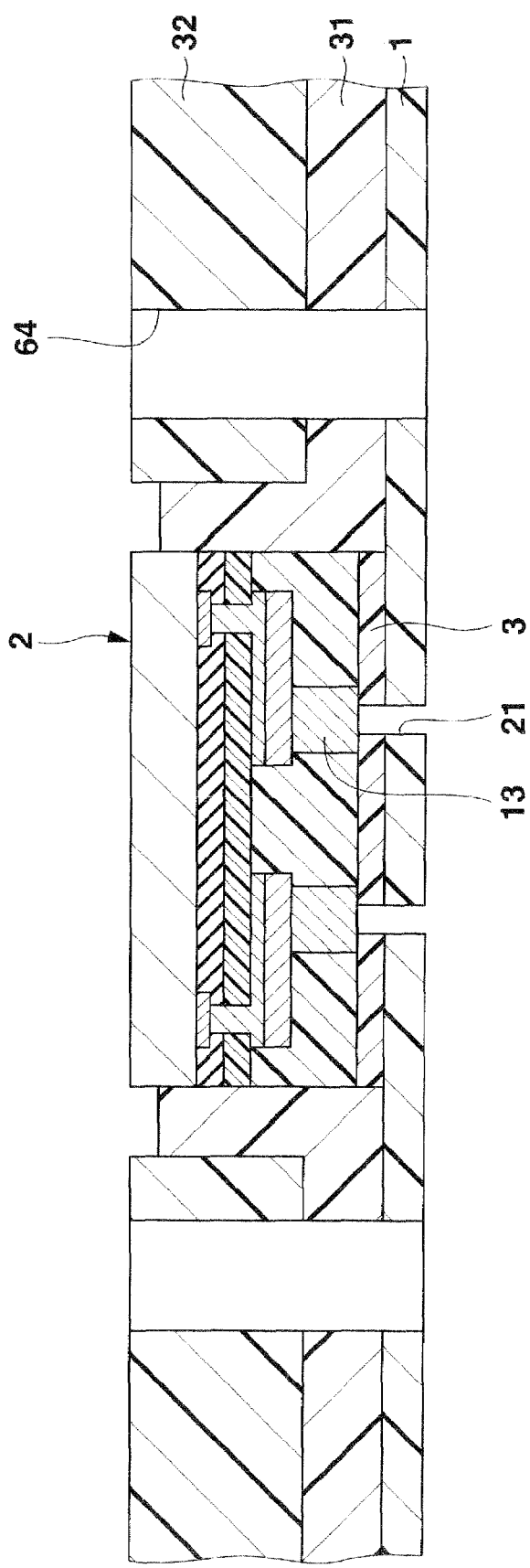
FIG. 26 is a sectional view of the assembly in a step subsequent to FIG. 25.

Then, as shown in FIG. 26, the under-layer insulating film 1 and the adhesive layer 3 in a portion corresponding to the center of the under surface of the columnar electrode 13 of the semiconductor constituent 2 are irradiated with a laser beam and thus provided with an opening 21 by laser processing. Moreover, the predetermined portions of the under-layer insulating film 1, the insulating layer 31 and the insulating substrate 32 are provided with a through hole 64 by use of a mechanical drill.

Figure 27:
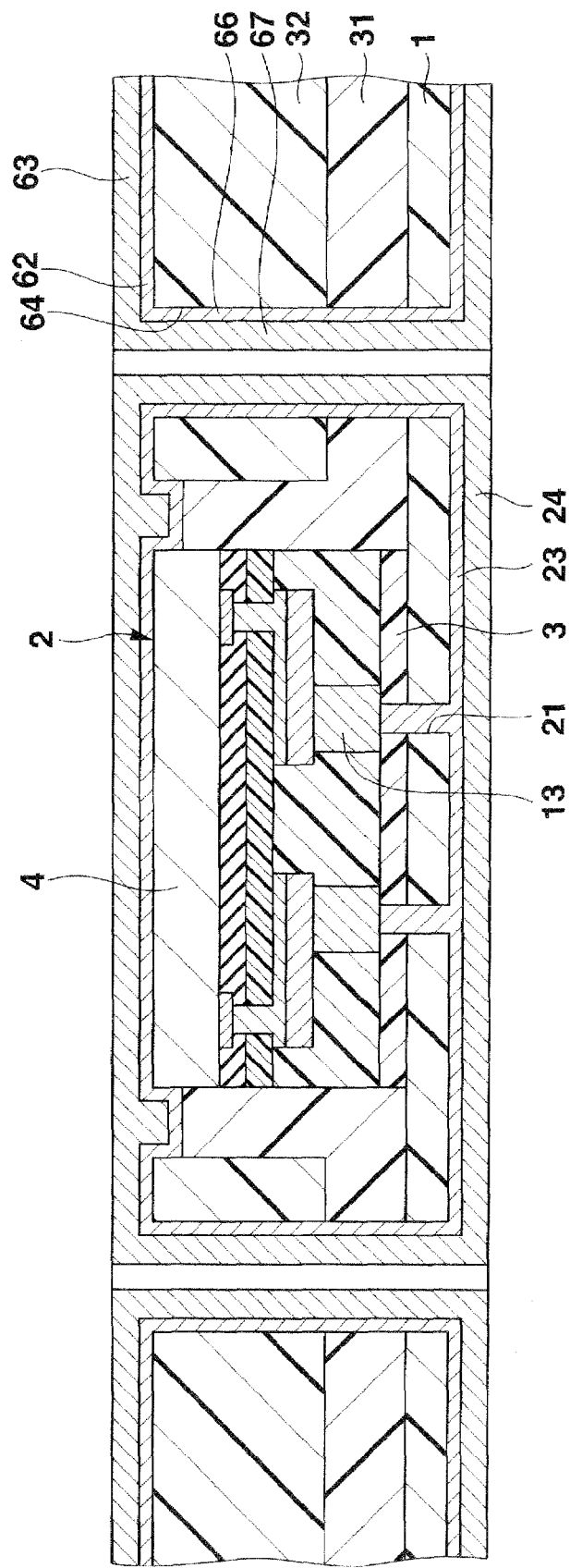
FIG. 27 is a sectional view of the assembly in a step subsequent to FIG. 26.

Next, as shown in FIG. 27, base metal layers 23, 62 and 66 are formed, by the electroless plating of copper, on the whole under surface of the under-layer insulating film 1 including the under surfaces of the columnar electrodes 13 of the semiconductor constituent 2 exposed through the openings 21 of the under-layer insulating film 1 and the adhesive layer 3, the whole upper surface of the insulating substrate 32, the upper surface of the silicon substrate 4 of the semiconductor constituent 2, and the upper surface of the insulating layer 31 and the inner wall surface of the through hole 64 between the surfaces. Next, the electrolytic plating of copper is performed using the base metal layers 23, 62 and 66 as plating current paths to form a lower metal layer 24 and lower metal layers 63, 67 on the surfaces of the base metal layers 23, 62 and 66, respectively.

Figure 28:
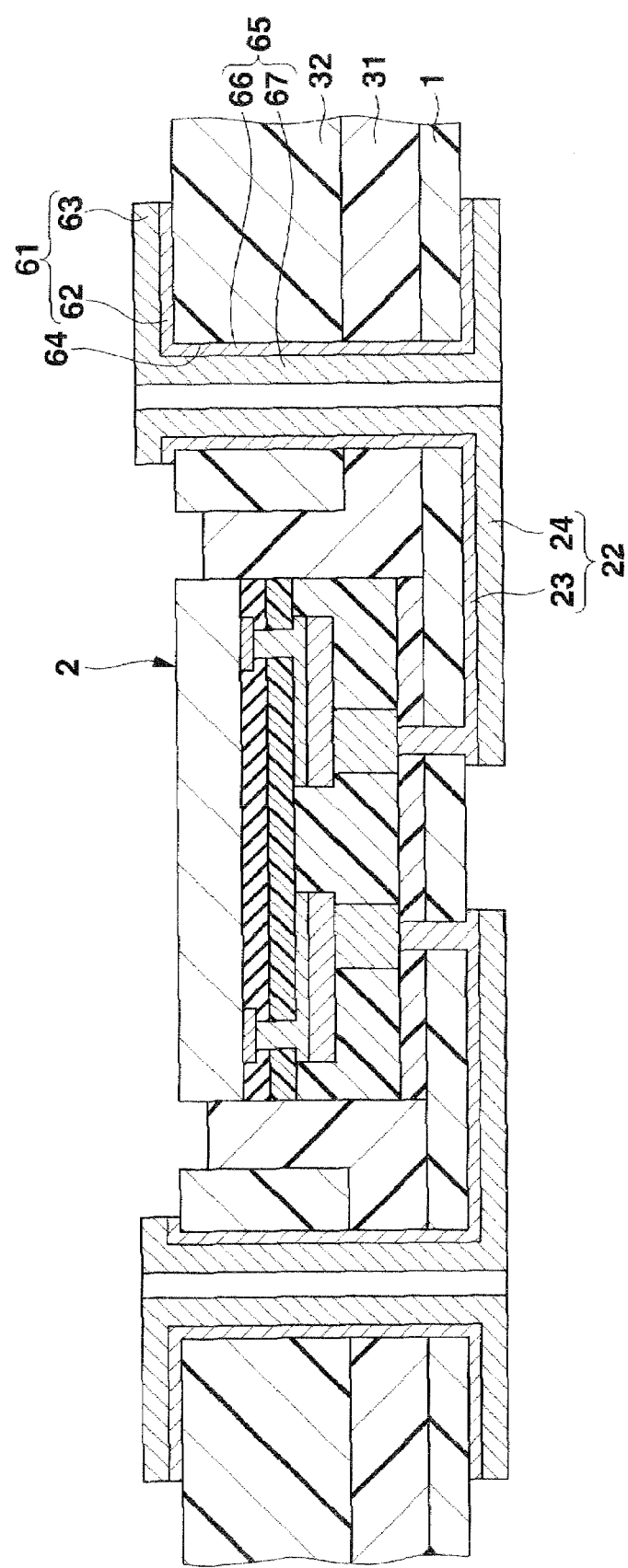
FIG. 28 is a sectional view of the assembly in a step subsequent to FIG. 27.

Then, the lower metal layers 24, 63 and the base metal layers 23, 62 are patterned by a photolithography process as shown in FIG. 28. That is, the under-layer wire 22 having the double-layer structure including the base metal layer 23 and the lower metal layer 24 is formed on the under surface of the under-layer insulating film 1. Moreover, the upper-layer wire 61 having a double-layer structure including the base metal layer 62 and the upper metal layer 63 is formed on the upper surface of the insulating substrate 32. Furthermore, the vertical conductive portion 65 having a double-layer structure including the base metal layer 66 and the upper metal layer 67 is formed on the inner wall surface of the through hole 64.

Figure 29:
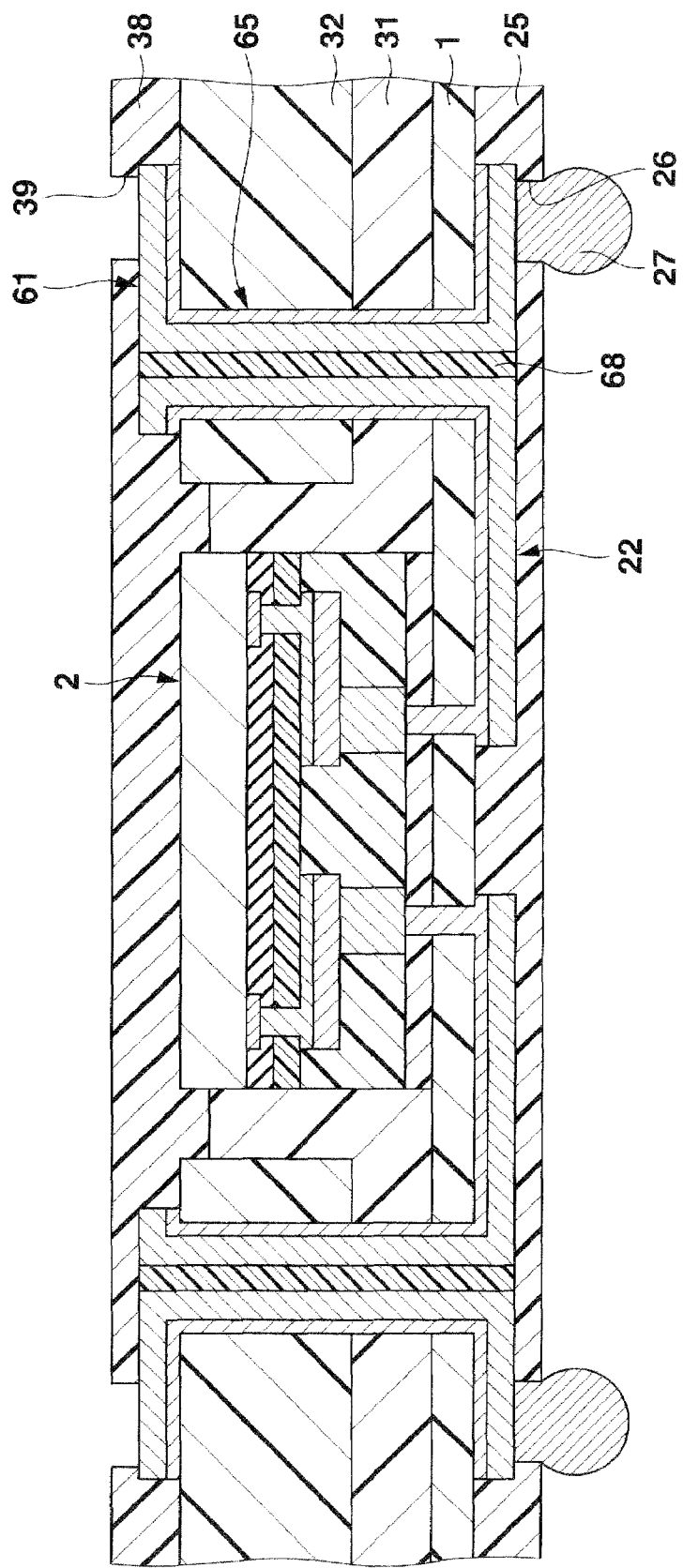
FIG. 29 is a sectional view of the assembly in a step subsequent to FIG. 28.

Next, as shown in FIG. 29, an under-layer overcoat film 25 made of a solder resist or the like is formed on the under surface of the under-layer insulating film 1 including the under-layer wire 22 by a screen printing process, a spin coating process or the like. Moreover, an upper-layer overcoat film 38 made of the solder resist or the like is formed on the upper surface of the insulating substrate 32 including the upper-layer wire 61, the upper surface of the silicon substrate 4 of the semiconductor constituent 2 and the upper surface of the insulating layer 31 between the surfaces by the screen printing process, the spin coating process or the like. In this state, the vertical conductive portion 65 is filled with a filling material 68 made of the solder resist or the like.

Then, the under-layer overcoat film 25 in a portion corresponding to the connection pad portion of the under-layer wire 22 is irradiated with a laser beam and thus provided with an opening 26 by laser processing. Moreover, the upper-layer overcoat film 38 in a portion corresponding to the connection pad portion of the upper-layer wire 61 is irradiated with the laser beam and thus provided with an opening 39 by laser processing.

Next, a solder ball 27 is connected to the connection pad portion of the under-layer wire 22 and formed in and under the opening 26 of the under-layer overcoat film 25. Then, when the under-layer overcoat film 25, the under-layer insulating film 1, the insulating layer 31, the insulating substrate 32 and the upper-layer overcoat film 38 are cut between the semiconductor constituents 2 disposed adjacent to each other, a plurality of semiconductor devices shown in FIG. 22 are obtained.

Also in the semiconductor device obtained in this manner, the under-layer wire 22 is connected to the columnar electrode 13 of the semiconductor constituent 2 under the semiconductor constituent 2 and under the under-layer insulating film 1 provided around the semiconductor constituent. Therefore, the arrangement region of the solder balls (electrodes for external connection) 27 can be set to a size larger than the planar size of the semiconductor constituent 2, and additionally any base plate 41 is not disposed, so that the device can be thinned.

Fifth Embodiment

Figure 30:
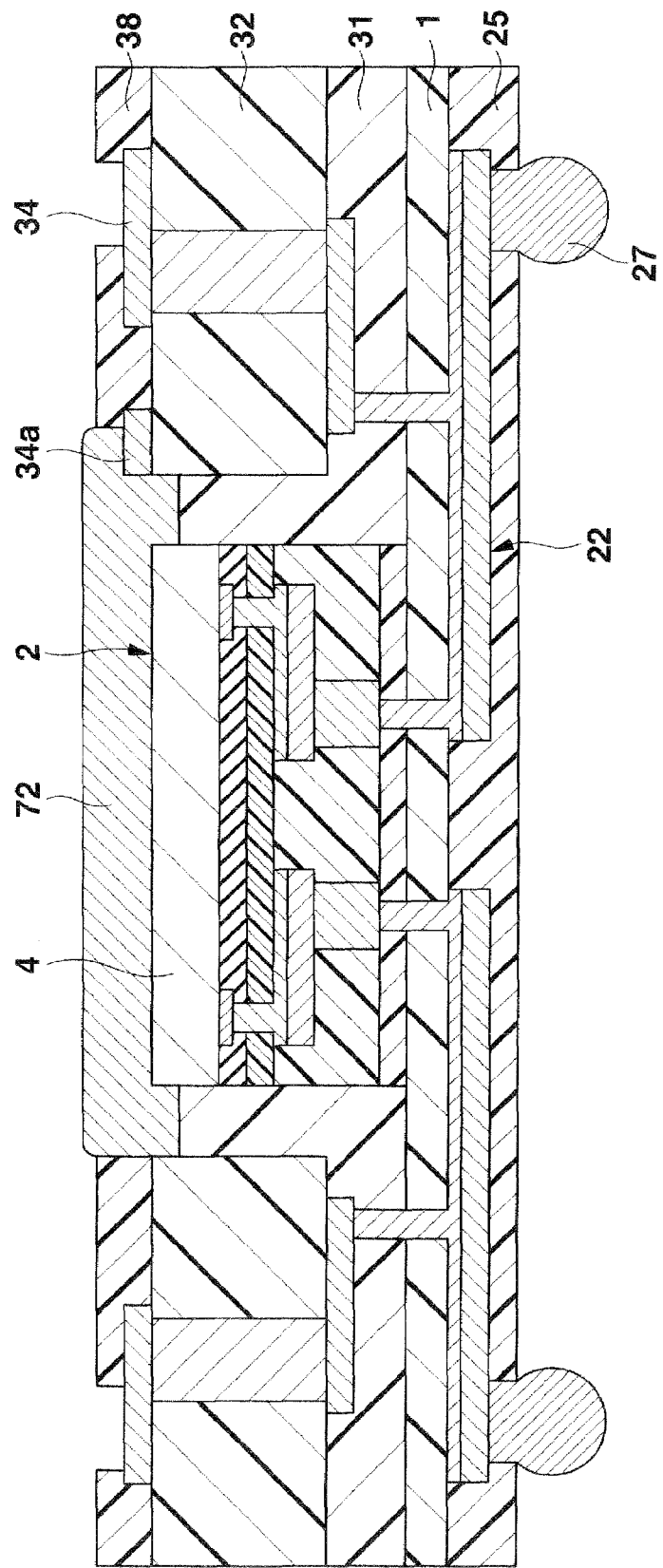
FIG. 30 is a sectional view of a semiconductor device according to a fifth embodiment of this invention.

FIG. 30 shows a sectional view of a semiconductor device according to a fifth embodiment of this invention. This semiconductor device is different from the semiconductor device shown in FIG. 1 in that a ground terminal 34a constituted of a part of an upper-layer wire 34 is exposed on the inner peripheral portion of the upper surface of an insulating substrate 32 and in that the upper surface of a silicon substrate 4 of a semiconductor constituent 2, the upper surface of an insulating layer 31 around the silicon substrate and the upper surface of the exposed ground terminal 34a are provided with a conductive layer 72 made of a conductive paste or the like. In this case, the upper surface of the silicon substrate 4 of the semiconductor constituent 2 can have a ground potential, and the upper surface side of the silicon substrate 4 of the semiconductor constituent 2 can become a sealed structure.

Sixth Embodiment

Figure 31:
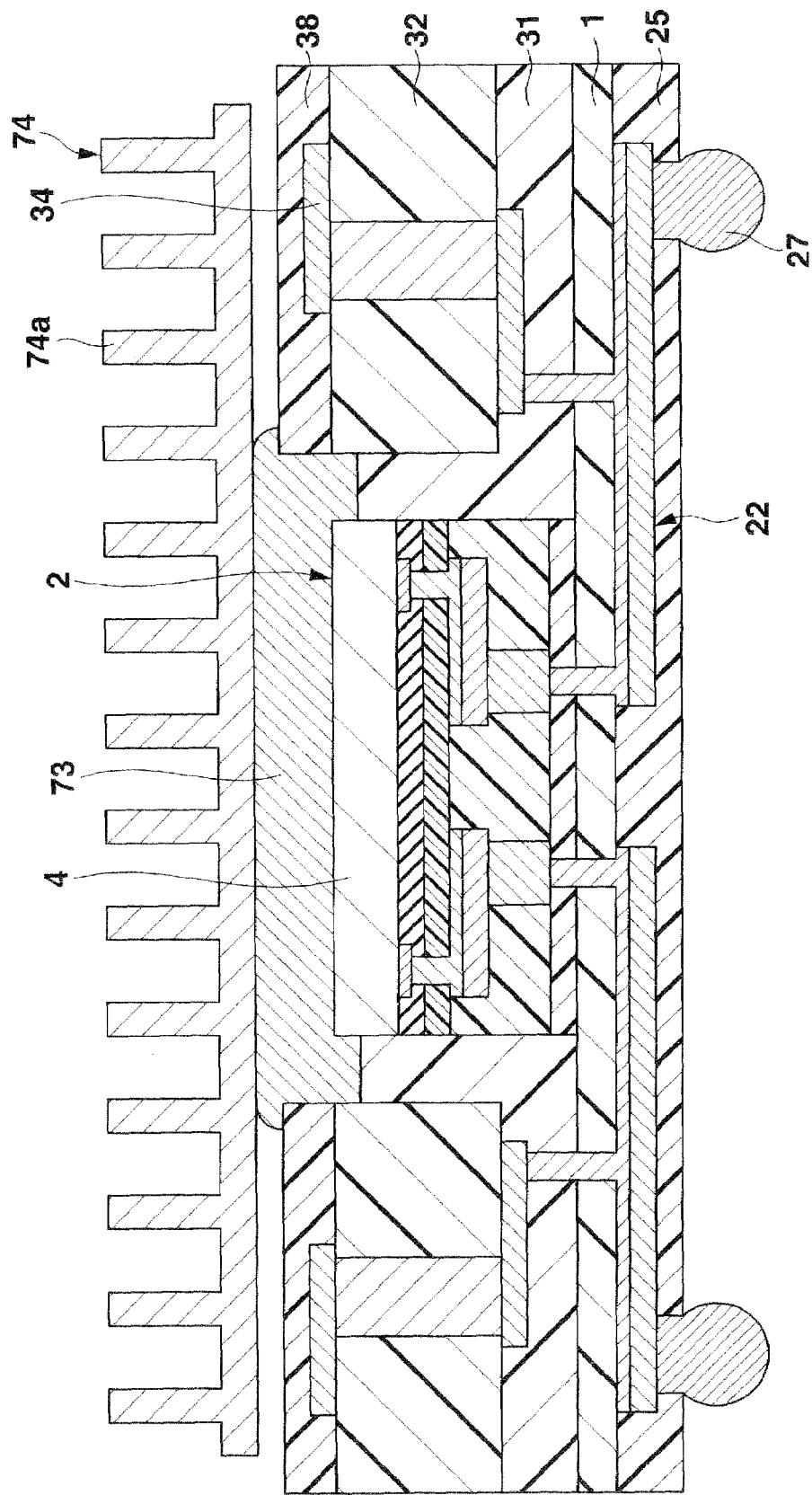
FIG. 31 is a sectional view of a semiconductor device according to a sixth embodiment of this invention.

FIG. 31 shows a sectional view of a semiconductor device according to a sixth embodiment of this invention. This semiconductor device is different from the semiconductor device shown in FIG. 1 in that the upper surface of a silicon substrate 4 of a semiconductor constituent 2, the upper surface of an insulating layer 31 around the upper surface of the silicon substrate and the upper surface of an upper-layer overcoat film 38 around the upper surface of the insulating layer are provided with a thermally conductive layer 73 made of a conductive paste or the like and in that the upper surface of the thermally conductive layer 73 is provided with a heat release member 74 having a large number of fins 74a. In this case, heat generated in an integrated circuit provided on the under surface of the silicon substrate 4 of the semiconductor constituent 2 can quickly be released via the thermally conductive layer 73 and the heat release member 74. In this case, the upper-layer overcoat film 38 in a portion corresponding to a connection pad of the upper-layer wire 34 is not provided with any opening 39.

Seventh Embodiment

Figure 32:
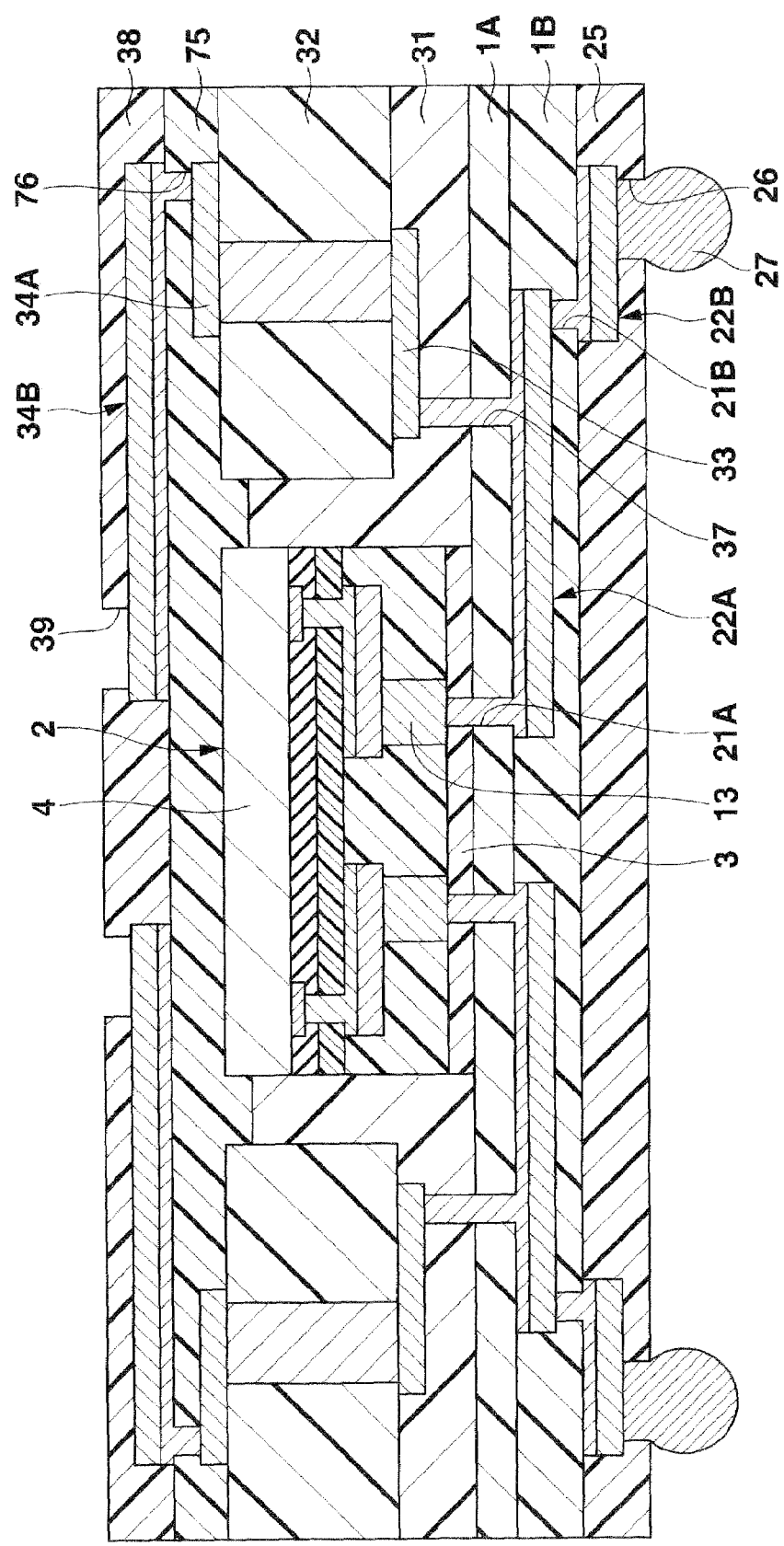
FIG. 32 is a sectional view of a semiconductor device according to a seventh embodiment of this invention.

FIG. 32 shows a sectional view of a semiconductor device according to a seventh embodiment of this invention. This semiconductor device is different from the semiconductor device shown in FIG. 1 in that an under-layer wire and an upper-layer wire have a multilayered (double-layer) wire structure. That is, one end of an under-layer wire 22A provided on the under surface of a first under-layer insulating film 1A is connected to an intermediate under-layer wire 33 of an insulating substrate 32 via an opening 37 provided in the first under-layer insulating film 1A and an adhesive layer 3, and the other end of the under-layer wire is connected to a columnar electrode 13 of the semiconductor constituent 2 via an opening 21A.

The under surfaces of the under-layer wire 22A and first under-layer insulating film 1A of the semiconductor constituent 2 is provided with a second under-layer insulating film 1B made of the same material as that of the first under-layer insulating film 1A. One end of a second under-layer wire 22B provided on the under surface of the second under-layer insulating film 1B is connected to the connection pad portion of the first under-layer wire 22A via an opening 21B provided in the second under-layer insulating film 1B. The under surfaces of the second under-layer wire 22B and second under-layer insulating film 1B are provided with an under-layer overcoat film 25. A solder ball 27 is connected to the connection pad portion of the second under-layer wire 22B in and under an opening 26 of the under-layer overcoat film 25.

The upper surface of the silicon substrate 4 of the semiconductor constituent 2, the upper surface of an insulating layer 31 around the upper surface of the silicon substrate and the upper surface of the insulating substrate 32 including a first upper-layer wire 34A are provided with an upper-layer insulating film 75 made of the same material as that of the first under-layer insulating film 1A. The upper surface of the upper-layer insulating film 75 is provided with a second upper-layer wire 34B having a double-layer structure. One end of the second upper-layer wire 34B is connected to the connection pad portion of the first upper-layer wire 34A via an opening 76 provided in the upper-layer insulating film 75. The upper surface of the upper-layer insulating film 75 including the second upper-layer wire 34B is provided with an upper-layer overcoat film 38. The upper-layer overcoat film 38 in a portion corresponding to the connection pad portion of the second upper-layer wire 34B is provided with an opening 39. The under-layer wire and the upper-layer wire may have a wire structure of three or more layers. It is to be noted that the multilayered wire structure is not limited to a double-layer wire, and a wire structure of three or more layers may be employed.

Eighth Embodiment

Figure 33:
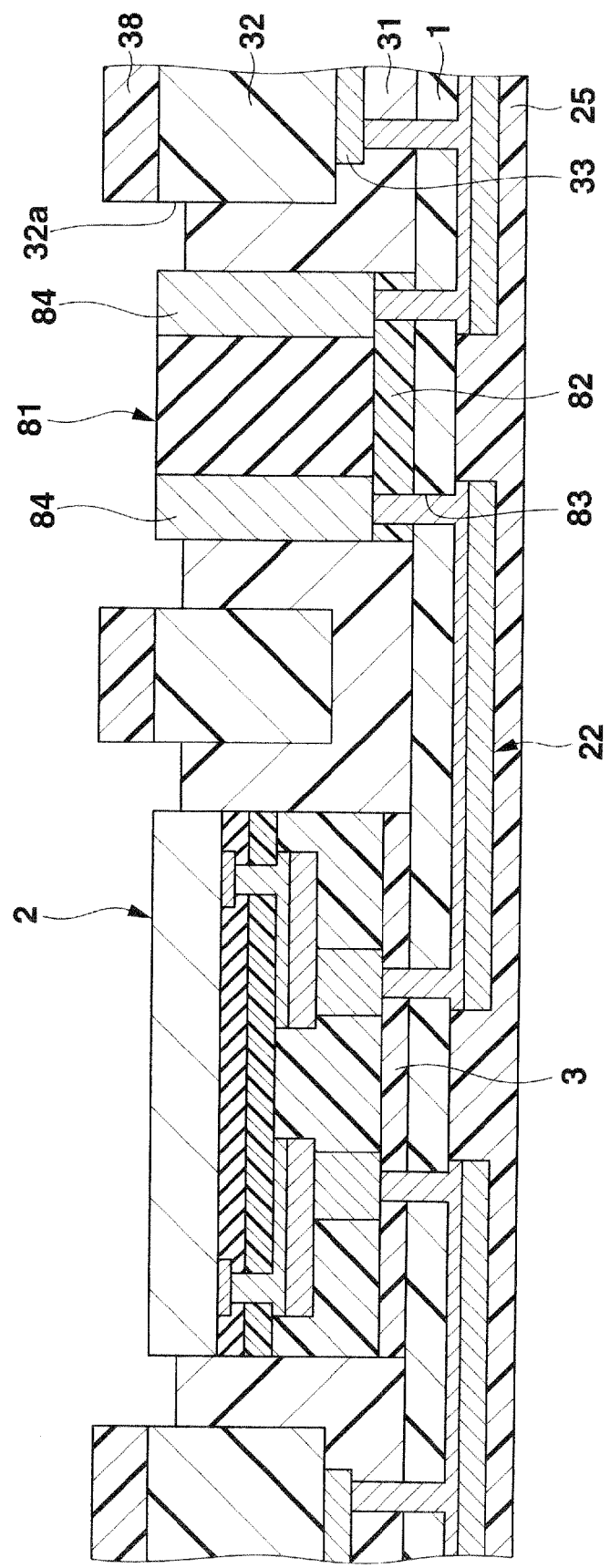
FIG. 33 is a sectional view of the main part of a semiconductor device according to an eighth embodiment of this invention.

FIG. 33 shows a sectional view of the main part of a semiconductor device according to an eighth embodiment of this invention. This semiconductor device is largely different from the semiconductor device shown in FIG. 1 in that a chip component 81 made of a resistor or a capacitor is bonded to the upper surface of an under-layer insulating film 1 around a semiconductor constituent 2 via an adhesive layer 82. The chip component 81 is inserted through an opening 32a provided through an insulating substrate 32, and arranged on the under-layer insulating film 1. In this case, ends of two under-layer wires 22 are connected to both electrodes 84 of the chip component 81 via an opening 83 formed in the under-layer insulating film 1 and the adhesive layer 82.

Ninth Embodiment

Figure 34:
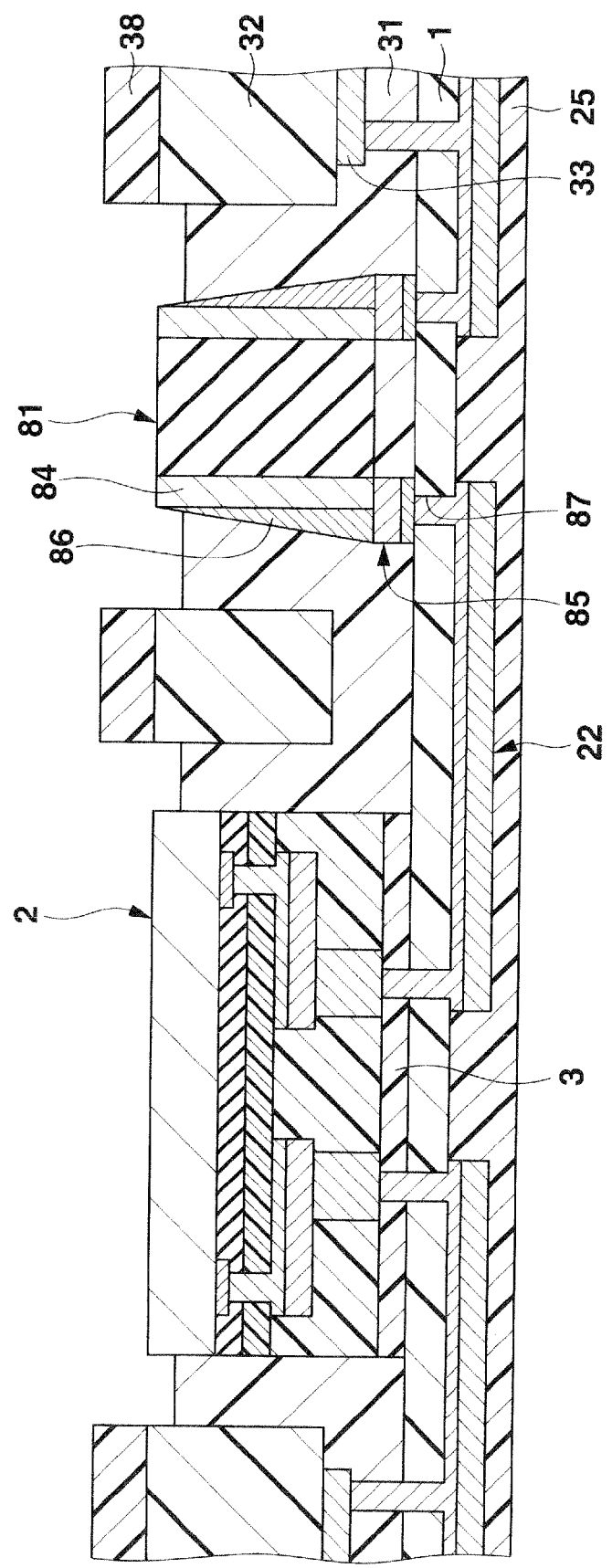
FIG. 34 is a sectional view of the main part of a semiconductor device according to a ninth embodiment of this invention.

FIG. 34 shows a sectional view of the main part of a semiconductor device according to a ninth embodiment of this invention. This semiconductor device is different from the semiconductor device shown in FIG. 33 in that a chip component 81 is mounted on two connection pads 85 having a double-layer structure beforehand formed on the upper surface of an under-layer insulating film 1 around a semiconductor constituent 2. In this case, both electrodes 84 of the chip component 81 are connected to the two connection pads 85 via solders 86. Moreover, an under-layer wire 22 is connected to the connection pad 85 via an opening 87 formed in the under-layer insulating film 1.

Tenth Embodiment

Figure 35:
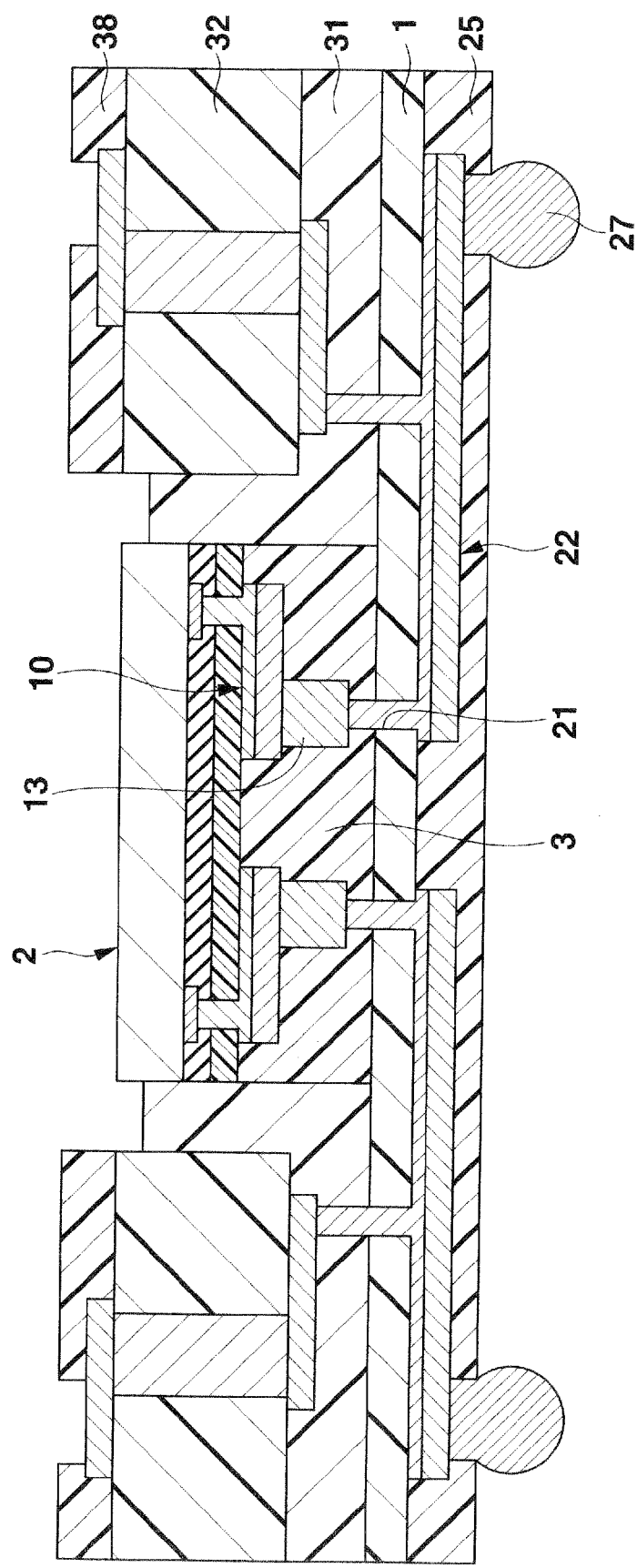
FIG. 35 is a sectional view of a semiconductor device according to a tenth embodiment of this invention.

FIG. 35 shows a sectional view of a semiconductor device according to a tenth embodiment of this invention. This semiconductor device is different from the semiconductor device shown in FIG. 1 in that a semiconductor constituent 2 does not include any sealing film 14 made of a non-adhesive material. That is, the under surface of a protective film 8 including a wire 10 and a columnar electrode 13 of the semiconductor constituent 2 is directly covered with the adhesive layer 3, and is bonded to the center of the upper surface of the under-layer insulating film 1 via an adhesive layer 3. Then, one end of an under-layer wire 22 is connected to the columnar electrode 13 of the semiconductor constituent 2 via an opening 21 of the under-layer insulating film 1 and the adhesive layer 3.

Eleventh Embodiment

Figure 36:
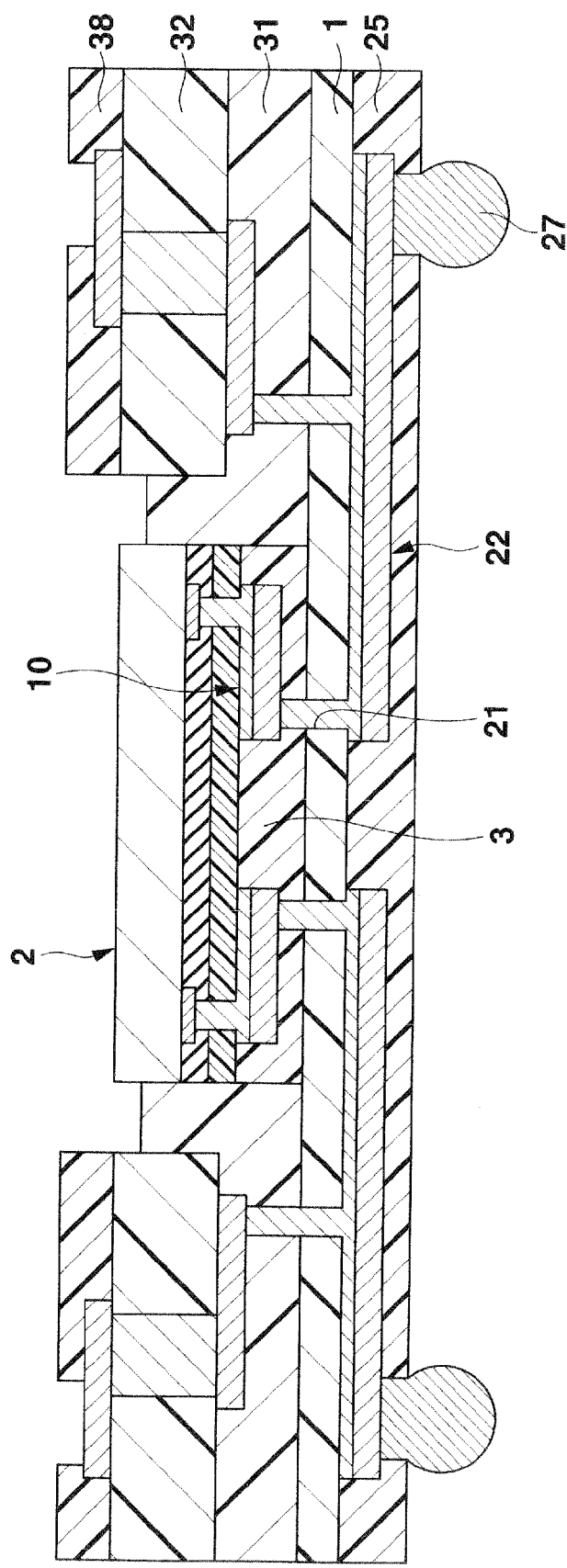
FIG. 36 is a sectional view of a semiconductor device according to an eleventh embodiment of this invention.

FIG. 36 shows a sectional view of a semiconductor device according to an eleventh embodiment of this invention. This semiconductor device is different from the semiconductor device shown in FIG. 35 in that a semiconductor constituent 2 does not include any columnar electrode 13. Therefore, in this case, the under surface of a protective film 8 including a wire 10 of the semiconductor constituent 2 is bonded to the center of the upper surface of an under-layer insulating film 1 via an adhesive layer 3. Then, one end of the under-layer wire 22 is connected to the connection pad portion (an electrode for external connection) of the wire 10 of the semiconductor constituent 2 via an opening 21 of the under-layer insulating film 1 and the adhesive layer 3.

Twelfth Embodiment

Figure 37:
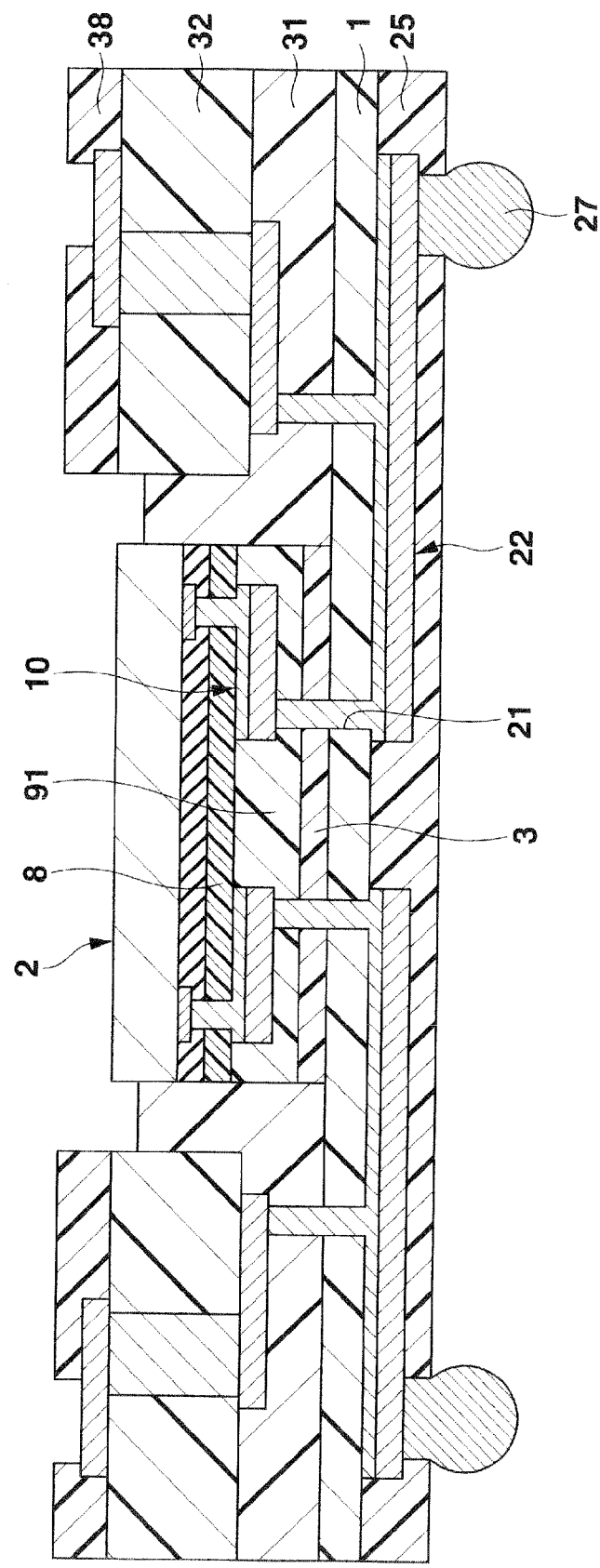
FIG. 37 is a sectional view of a semiconductor device according to a twelfth embodiment of this invention.

FIG. 37 shows a sectional view of a semiconductor device according to a twelfth embodiment of this invention. This semiconductor device is different from the semiconductor device shown in FIG. 36 in that the under surface of a protective film 8 including a wire 10 of a semiconductor constituent 2 is provided with an antistatic protective film 91 made of an insulating material such as a polyimide-based resin or an epoxy-based resin. Therefore, in this case, the under surface of the antistatic protective film 91 of the semiconductor constituent 2 is bonded to the center of the upper surface of an under-layer insulating film 1 via an adhesive layer 3. Then, one end of an under-layer wire 22 is connected to the connection pad portion of the wire 10 of the semiconductor constituent 2 via an opening 21 formed in the under-layer insulating film 1, the adhesive layer 3 and the protective film 91.

In addition, the protective film 91 is not provided with the opening 21 before mounting the semiconductor constituent 2 on the under-layer insulating film 1. Then, the protective film 91 which does not have any opening 21 protects an integrated circuit formed under a silicon substrate 4 from static electricity from a time when the protective film itself is formed under the silicon substrate 4 having a wafer state to a time when the semiconductor constituent 2 is mounted on the under-layer insulating film 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device, comprising:

forming an under-layer insulating film on a base plate;

securing, onto the under-layer insulating film, a plurality of semiconductor constituents each having a semiconductor substrate and a plurality of electrodes for external connection provided under the semiconductor substrate;

forming an insulating layer on the under-layer insulating film around the semiconductor constituents, and embedding a frame-like insulating substrate in an upper surface of the insulating layer;

removing the base plate;

connecting under-layer wires to the electrodes for external connection of the semiconductor constituent under the under-layer insulating film; and cutting the under-layer insulating film, the insulating layer and the insulating substrate between the semiconductor constituents to obtain a plurality of semiconductor devices, wherein each of semiconductor devices has an upper-layer wire formed on the insulating substrate.

2. The manufacturing method of the semiconductor device according to claim 1, wherein the removing the base plate is performed by etching.

3. The manufacturing method of the semiconductor device according to claim 2, wherein the base plate is made of a metal foil, and the removing the base plate is performed by wet etching of using an etching solution.

4. The manufacturing method of the semiconductor device according to claim 1, wherein the securing the semiconductor constituent onto the under-layer insulating film includes beforehand supplying an adhesive material onto the under-layer insulating film and heating/pressurizing the semiconductor constituent on the under-layer insulating film.

5. The manufacturing method of the semiconductor device according to claim 1, wherein the securing the semiconductor constituent onto the under-layer insulating film includes beforehand supplying an adhesive sheet onto the under-layer insulating film and heating/pressurizing the semiconductor constituent on the under-layer insulating film.

6. The manufacturing method of the semiconductor device according to claim 1, wherein the insulating substrate is beforehand provided with another under-layer wire the upper-layer wire and a vertical conductive portion which connects the wires to each other, and the under-layer wire is connected to the other under-layer wire under the under-layer insulating film.

7. The manufacturing method of the semiconductor device according to claim 6, wherein an upper-layer overcoat film having an opening in a portion corresponding to the connection pad portion of the upper-layer wire is beforehand provided on the upper-layer wire and the insulating substrate, a protective film is attached onto the upper-layer overcoat film before removing the base plate, and the protective film is peeled after forming the under-layer wire.

8. The manufacturing method of the semiconductor device according to claim 6, wherein a protective film is attached onto the upper-layer wire and the insulating substrate before removing the base plate, and the protective film is peeled after forming the under-layer wire.

9. The manufacturing method of the semiconductor device according to claim 1, wherein after removing the base plate, a through hole is formed through the under-layer insulating film, the insulating layer and the insulating substrate, and the forming the under-layer wire includes forming the upper-layer wire on the insulating substrate, and connecting a vertical conductive portion to the under-layer wire and the upper-layer wire to form the vertical conductive portion in the through hole.

10. The manufacturing method of the semiconductor device according to claim 1, wherein a protective metal layer and a base metal layer are formed on the base plate made of a metal, the under-layer insulating film is formed on the base metal layer, and the removing the base plate includes the of removing the protective metal layer.

11. The manufacturing method of the semiconductor device according to claim 10, wherein the upper surface of the base metal layer is beforehand subjected to a coarse surface forming treatment, and the under-layer insulating film is formed of a material including resin.

12. The manufacturing method of the semiconductor device according to claim 11, wherein the forming the under-layer wire includes forming another base metal layer under the base metal layer, and forming an lower metal layer under the other base metal layer by electrolytic plating, whereby the under-layer wire has a three-layer structure of the base metal layer, the other base metal layer and the lower metal layer.

13. The manufacturing method of the semiconductor device according to claim 12, wherein the base plate, the base metal layer, the other base metal layer and the lower metal layer are made of a metal including copper, and the protective metal layer is made of a metal including nickel.

* * * * *